US009141194B1

(12) United States Patent
Keyes et al.

(10) Patent No.: US 9,141,194 B1
(45) Date of Patent: Sep. 22, 2015

(54) MAGNETOMETER-BASED GESTURE SENSING WITH A WEARABLE DEVICE

(75) Inventors: Edward Keyes, Mountain View, CA (US); Michael Patrick Johnson, Sunnyvale, CA (US); Thad Starner, Mountain View, CA (US)

(73) Assignee: Google Inc., Mountain View, CA (US)

( * ) Notice: Subject to any disclaimer, the term of this patent is extended or adjusted under 35 U.S.C. 154(b) by 782 days.

(21) Appl. No.: 13/343,652

(22) Filed: Jan. 4, 2012

(51) Int. Cl.
 *G06F 3/01* (2006.01)
(52) U.S. Cl.
 CPC ..................................... *G06F 3/017* (2013.01)
(58) Field of Classification Search
 CPC ................................. G06F 3/017; G01C 17/02
 USPC .......................................... 702/150, 152, 153
 See application file for complete search history.

(56) References Cited

U.S. PATENT DOCUMENTS

| | | | |
|---|---|---|---|
| 7,192,136 B2 | 3/2007 | Howell et al. | |
| 7,255,437 B2 | 8/2007 | Howell et al. | |
| 7,301,648 B2 | 11/2007 | Foxlin | |
| 7,365,736 B2 * | 4/2008 | Marvit et al. | 345/156 |
| 7,380,936 B2 | 6/2008 | Howell et al. | |
| 7,401,918 B2 | 7/2008 | Howell et al. | |
| 7,438,410 B1 | 10/2008 | Howell et al. | |
| 7,481,531 B2 | 1/2009 | Howell et al. | |
| 7,500,746 B1 | 3/2009 | Howell et al. | |
| 7,500,747 B2 | 3/2009 | Howell et al. | |
| 7,543,934 B2 | 6/2009 | Howell et al. | |
| 7,581,833 B2 | 9/2009 | Howell et al. | |
| 7,621,634 B2 | 11/2009 | Howell et al. | |
| 7,760,898 B2 | 7/2010 | Howell et al. | |
| 7,771,046 B2 | 8/2010 | Howell et al. | |
| 7,792,552 B2 | 9/2010 | Thomas et al. | |
| 7,806,525 B2 | 10/2010 | Howell et al. | |
| 7,834,893 B2 | 11/2010 | Wanda et al. | |
| 7,834,909 B2 | 11/2010 | Katano et al. | |
| 7,922,321 B2 | 4/2011 | Howell et al. | |
| 8,109,629 B2 | 2/2012 | Howell et al. | |

(Continued)

OTHER PUBLICATIONS

Ketabdar et al., Towards Using Embedded Magnetic Field Sensor for Around Mobile Device 3D Interaction, Sep. 7-10, 2010, MobileHCI 2010, p. 153-156.*

(Continued)

*Primary Examiner* — Eliseo Ramos Feliciano
*Assistant Examiner* — I-Hui E Liu
(74) *Attorney, Agent, or Firm* — McDonnell Boehnen Hulbert & Berghoff LLP

(57) ABSTRACT

A wearable computing device such as a head-mounted display (HMD) may be equipped with a magnetometer for detecting presence and motion of a hand-wearable magnet (HWM). The HMD may analyze magnetic field measurements of the magnetometer to determine when the HWM moves within a threshold distance of the magnetometer, and may thereafter determine one or more patterns of motion of the HWM based the magnetic field measurements. The HMD may operate in a background detection state in order to determine a background magnetic field strength and to monitor for magnetic disturbances from the HWM. Upon occurrence of a trigger event corresponding to magnetic disturbance above a threshold level, the HMD may transition to operating in a gesture detection state in which it analyzes magnetometer measurements for correspondence with known gestures. Upon recognizing a known gesture, the HMD may carry out one or more actions based on the recognized known gesture.

35 Claims, 9 Drawing Sheets

(56) References Cited

U.S. PATENT DOCUMENTS

| | | | |
|---|---|---|---|
| 2007/0220108 A1* | 9/2007 | Whitaker | 709/217 |
| 2008/0243417 A1* | 10/2008 | Yanni et al. | 702/95 |
| 2010/0013465 A1* | 1/2010 | Sautter et al. | 324/207.11 |
| 2010/0161084 A1* | 6/2010 | Zhao et al. | 700/85 |
| 2010/0275166 A1* | 10/2010 | Jeon et al. | 715/863 |
| 2010/0321383 A1 | 12/2010 | Nakamura | |
| 2011/0163947 A1* | 7/2011 | Shaw et al. | 345/156 |
| 2011/0190060 A1* | 8/2011 | Ketabdar et al. | 463/37 |
| 2011/0213664 A1 | 9/2011 | Osterhout et al. | |

OTHER PUBLICATIONS

Zimmerman et al., A Hand Gesture Interface Device, 1987, CHI '87 Proceedings, p. 189-192.*

Ketabdar et al., MagiTact: Interaction with Mobile Devices Based on Compass (Magnetic) Sensor, Feb. 7-10, 2010, IUI'10.*

Wheeler, Donald J., Understanding Variation the Key to Managing Chaos, 2000, SPC Press, Ed. 2, p. 65-66.*

Ketabdar et al., "MagiSign: User Identification/Authentication", 2010, UBICOMM 2010: The Fourth International Conference on MObile Ubiquitous Computing, Systems, Services and Technologies, p. 31-34.*

"MagiTact: Interaction with Mobile Devices Based on Compass (Magnetic) Sensor," Hamed Ketabdar, Kamer Ali Yuksel, and Mehran Roshandel, IUI'10, Feb. 7-10, 2010, Hong Kong, China, ACM 978-1-60558-515-4/10/02.

"Nenya: Subtle and Eyes-Free Mobile Input with a Magnetically-Tracked Finger Ring," Daniel Ashbrook, Patrick Baudisch, and Sean White, CHI 2011, May 7-12, 2011, Vancouver, BC, Canada, Copyright 2011 ACM 978-1-4503-0267-8/11/05.

"Abracadabra: Wireless, High-Precision, and Unpowered Finger Input for Very Small Mobile Devices," Chriss Harrison, and Scott E. Hudson, UIST'09, Oct. 4-7, 2009, Victoria, British Columbia, Canada, Copyright 2009 ACM 978-1-60558-745-5/09/10.

* cited by examiner

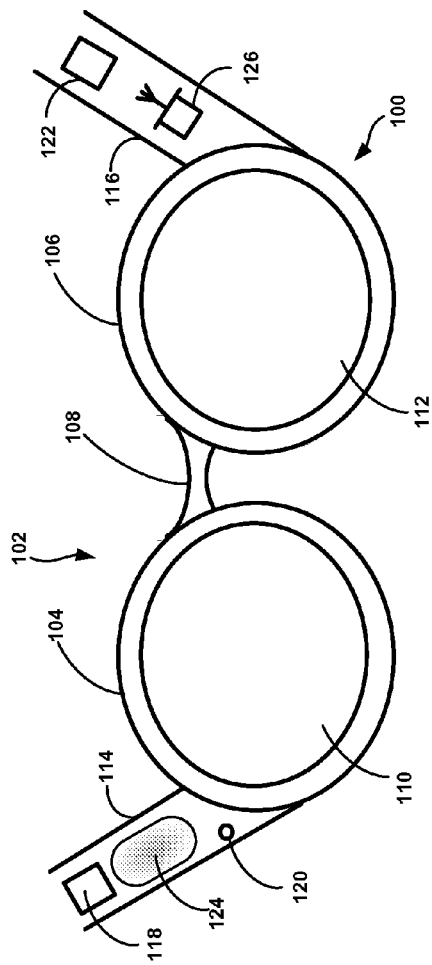
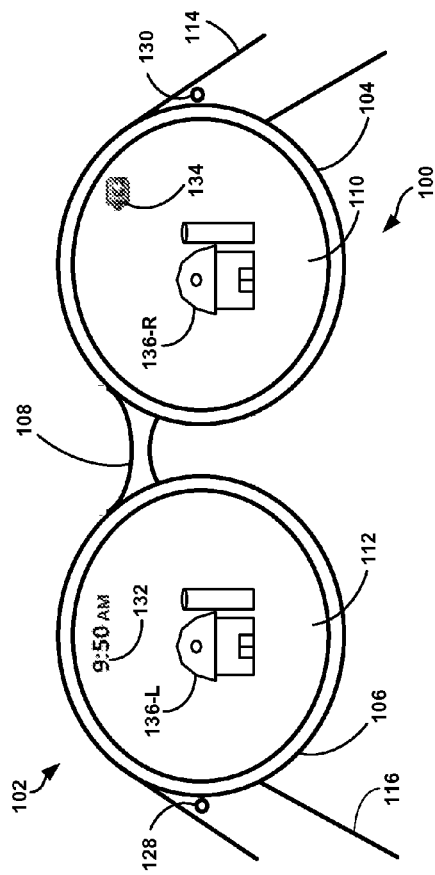
FIG. 1a
FIG. 1b

MAGNETOMETER-BASED GESTURE SENSING WITH A WEARABLE DEVICE

BACKGROUND

Unless otherwise indicated herein, the materials described in this section are not prior art to the claims in this application and are not admitted to be prior art by inclusion in this section.

Various technologies can be utilized to provide users with electronic access to data and services in communication networks, as well as to support communication between users. For example, devices such as computers, telephones, and personal digital assistants (PDAs) can be used to exchange information over communication networks including the Internet. Communication networks may in turn provide communication paths and links to servers, which can host applications, content, and services that may be accessed or utilized by users via communication devices. The content can include text, video data, audio data and/or other types of data.

SUMMARY

In one aspect, an example embodiment presented herein provides, in a wearable head-mounted display (HMD) having a processor and a magnetometer device with three orthogonal measurement axes, a computer-implemented method comprising: operating in a background detection state; while operating in the background detection state, carrying out functions of the background state including, measuring three orthogonal components of a background magnetic field with the magnetometer device, and determining a field magnitude of the background magnetic field from the three measured orthogonal components, determining an occurrence of a trigger from a hand-wearable magnet (HWM) at a time $T_{start}$ upon detecting a perturbation by the HWM of the determined field magnitude at least as large as a perturbation threshold, and upon determining the occurrence of the trigger, transitioning to operating in a gesture detection state; and while operating in the gesture detection state, carrying out functions of the gesture detection state including, tracking motion of the HWM by determining time derivatives of magnetic field strength measured by the magnetometer device along each of the three orthogonal measurement axes, making a comparison of the determined time derivatives with one or more sets of pre-determined time derivatives of magnetic field strength, each of the one or more sets being stored at the wearable HMD and each being associated with a respective known gesture, upon matching the determined time derivatives with a particular set of the one or more sets based on the comparison, identifying the respective known gesture associated with the particular set, and transitioning to operating in the background detection state upon both of, measuring the magnitude perturbation by the HWM of the determined field magnitude to be less than the perturbation threshold, and determining an expiration of a time interval W that begins at $T_{start}$.

In another aspect, an example embodiment presented herein provides a wearable head-mount display (HMD) comprising: a processor; memory; a magnetometer device with three orthogonal measurement axes; means for operating in a background detection state, wherein operating in the background detection state comprises carrying out functions of the background state including, measuring three orthogonal components of a background magnetic field with the magnetometer device, and determining a field magnitude of the background magnetic field from the three measured orthogonal components, determining an occurrence of a trigger from a hand-wearable magnet (HWM) at a time $T_{start}$ upon detecting a perturbation by the HWM of the determined field magnitude at least as large as a perturbation threshold, and upon determining the occurrence of the trigger, transitioning to operating in a gesture detection state; and means for operating in the gesture detection state, wherein operating in the gesture detection state comprises carrying out functions of the gesture detection state including, tracking motion of the HWM by determining time derivatives of magnetic field strength measured by the magnetometer device along each of the three orthogonal measurement axes, making a comparison of the determined time derivatives with one or more sets of pre-determined time derivatives of magnetic field strength, wherein each of the one or more sets is stored at the wearable HMD and each is associated with a respective known gesture, upon matching the determined time derivatives with a particular set of the one or more sets based on the comparison, identifying the respective known gesture associated with the particular set, and transitioning to operating in the background detection state upon both of, measuring the magnitude perturbation by the HWM of the determined field magnitude to be less than the perturbation threshold, and determining an expiration of a time interval W that begins at $T_{start}$.

In still another aspect, an example embodiment presented herein provides a nontransitory computer-readable medium having instructions stored thereon that, upon execution by one or more processors of a wearable head-mounted display (HMD), cause the wearable HMD to carry out operations comprising: operating in a background detection state; while operating in the background detection state, carrying out functions of the background state including, measuring three orthogonal components of a background magnetic field using three orthogonal measurement axes of magnetometer device of the wearable HMD, and determining a field magnitude of the background magnetic field from the three measured orthogonal components, determining an occurrence of a trigger from a hand-wearable magnet (HWM) at a time $T_{start}$ upon detecting a perturbation by the HWM of the determined field magnitude at least as large as a perturbation threshold, and upon determining the occurrence of the trigger, transitioning to operating in a gesture detection state; and while operating in the gesture detection state, carrying out functions of the gesture detection state including, tracking motion of the HWM by determining time derivatives of magnetic field strength measured by the magnetometer device along each of the three orthogonal measurement axes, making a comparison of the determined time derivatives with one or more sets of pre-determined time derivatives of magnetic field strength, wherein each of the one or more sets is configured to be stored at the wearable HMD and each is associated with a respective known gesture, upon matching the determined time derivatives with a particular set of the one or more sets based on the comparison, identifying the respective known gesture associated with the particular set, and transitioning to operating in the background detection state upon both of, measuring the magnitude perturbation by the HWM of the determined field magnitude to be less than the perturbation threshold, and determining an expiration of a time interval W that begins at $T_{start}$.

These as well as other aspects, advantages, and alternatives will become apparent to those of ordinary skill in the art by reading the following detailed description, with reference where appropriate to the accompanying drawings. Further, it should be understood that this summary and other descriptions and figures provided herein are intended to illustrative embodiments by way of example only and, as such, that numerous variations are possible. For instance, structural elements and process steps can be rearranged, combined, distributed, eliminated, or otherwise changed, while remaining within the scope of the embodiments as claimed.

BRIEF DESCRIPTION OF DRAWINGS

FIG. 1a is a first view of an example wearable head-mounted display, in accordance with an example embodiment.

FIG. 1b is a second view of an example wearable head-mounted display of FIG. 1a, in accordance with an example embodiment.

FIG. 9a depicts a state diagram including a background detection state and gesture recording state, according to an example embodiment.

DETAILED DESCRIPTION

1. Overview

Figure 2:
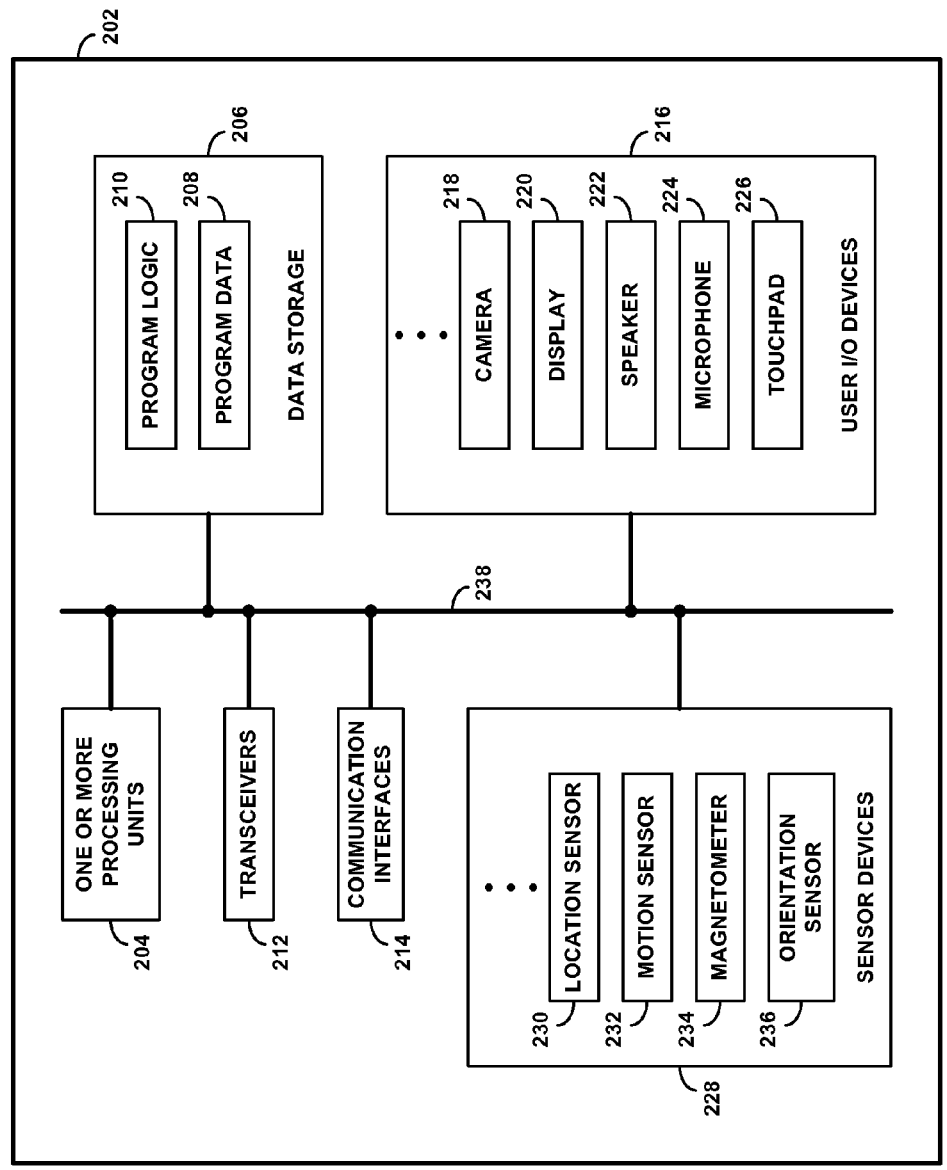
FIG. 2 is block diagram of a wearable head-mounted display, in accordance with an example embodiment.

In accordance with example embodiments, a wearable computing device may include a head-mounted display (HMD) equipped with a magnetometer device for detecting the presence and motion of a hand-wearable magnet (HWM), such as a magnetic ring or other hand-wearable item bearing a magnetic element. Detecting the presence and motion of the HWM can be used recognize known patterns of motion of the HWM that correspond to known gestures. Recognition of known patterns of motion may thereby be used to identify of known gestures, and identification of known gestures may provide a basis for user input to the HMD. For example, a particular gesture could be associated with a particular command, application, or other invocable action on the HMD.

Also in accordance with example embodiments, a head-mounted display (HMD) may also include eyeglasses or goggles that can combine computer-generated images displayed on the eye-facing surfaces of lens elements with an actual field of view observable through the lens elements. The capability of presenting the combination of the actual, observed field-of-view (FOV) with the displayed, computer-generated images can be complemented or supplemented with various functions and applications, as well as with various forms of user input and sensory data from ancillary wearable computing components, to provide rich and varied experiences and utility for a user or wearer of the HMD.

In example embodiments, the magnetometer device of the HMD may be configured to detect the presence and motion of the HWM predominantly within a spherical (or approximately spherical) volume of space of approximately arm's-length in diameter and centered (or nearly centered) at and surrounding the HMD, referred to herein as a "gesture detection region." Accordingly, hand gestures detected via motion of the HWM may be associated with the wearer of the HMD; i.e., those gestures made generally within the wearer's arm's length of the magnetometer-equipped HMD.

More specifically, the magnetic field strength of a small magnet or other source that may be practically configured as the magnetic element of the HWM typically falls rapidly with distance from the source (e.g., as $r^{-3}$ for a dipole field for distance r), so that beyond a threshold distance (e.g., approximately half of a meter) the HWM may not be detectable above a threshold field strength by the magnetometer device. The gesture detection region may be seen as a spherical (or approximately spherical) region within which the distance from the HWM to the magnetometer device is smaller than the threshold distance. Furthermore, since the field strength of the HWM falls rapidly with distance, the boundary of the gesture detection region may be relatively sharp.

In accordance with example embodiments, the size and shape of the gesture detection region, as well as the sharpness of the boundary, may be configured to depend on the sensitivity of the magnetometer device, and the strength and the geometry of the magnetic field of the HWM (e.g., dipole, multipole, etc.), among other possible factors. For example, the field strength of a dipole magnet decreases as $r^{-3}$, whereas a quadrupole field drops off as $r^{-4}$. By combining dipole and quadrupole magnets, a field having non-spherical shape and non-isotropic decrease in field-strength can be configured so as to result in a non-spherical gesture detection region having sharp boundaries in a well-defined region. Other multipole fields could be used as well for similar refining purposes. The ability to engineer the size and shape of the gesture detection region can further enhance precision, accuracy, and reliability of gesture detection and recognition.

In accordance with example embodiments, the field of the HWM may be detected as a deviation from a background magnetic field. More particularly, at any given time the magnetic field in the vicinity of the magnetometer device can be characterized as vector sum of a background magnetic field (typically dominated by the Earth's magnetic field) and a possible contribution due to the magnetic field of the HWM. Beyond the gesture detection region, the magnetic field of the HWM measured by the magnetometer device may be much weaker than the background field, and consequently can be treated as a perturbation of the geomagnetic field. As such, the field of the HWM may be considered to be detected if the magnetometer device measures a perturbation above a perturbation threshold. In practice, detection of the HWM above the threshold may be largely restricted to a region within the gesture detection region, and correspondingly to when the HWM is located within the gesture detection region.

Also in accordance with example embodiments, the magnetometer device may be configured to measure a magnetic field strength along each of three orthogonal directions (i.e., vector components along three orthogonal axes) in a frame of reference fixed to the magnetometer device. A magnitude of the magnetic field can then be determined from the measured strength of the vector components. By continuously computing a time average of the field magnitude, detection of the HWM above the perturbation threshold can be determined by comparison of the field magnitude measured at a given time with the time averaged value. Since the boundary of the gesture detection region can be very sharp, a perturbation exceeding the threshold can occur very rapidly in comparison with the typical time duration of a gesture, and can therefore serve as a trigger condition to signal the start time of a "gesture detection window" within which a gesture may be detected. More particularly, the HMD may begin interpreting detected presence and motion of the HWM as measured by the magnetometer device as a potential gesture upon occurrence of a trigger condition, and may cease interpreting when the trigger condition is no longer met, when the interpreted presence and motion are identified as a known gesture, or some combination of both.

In accordance with example embodiments, during a gesture detection window, the HMD will begin acquiring time-sampled measurements of the field strength of each of the vector components. For each vector component, a discrete time derivative can be computed as a difference between the field strengths of successive samples. The discrete time derivatives of the vector field, obtained from the discrete time derivatives of the vector components, may then be compared to digitally stored vector-field time derivatives associated with known (e.g., cataloged) gestures. For example, the comparison could be based on a statistical regression analysis or on a hidden Markov model algorithm. If and when a match is determined from a comparison, the associated gesture can then be identified as a particular known gesture. The HMD may then carry out an action or operation associated with the particular known gesture. If no match is found, the presence and motion of the HWM detected during the gesture-recognition window may be considered as spurious with regard to any potential gesture.

The HMD may continue to monitor the trigger condition during the gesture detection window. The gesture detection window may end upon the first occurrence of any one of (a) the trigger condition ceasing to be met, (b) successful determination of an intended gesture, or (c) determination that detected presence and motion of the HWM is spurious. The gesture detection window could also have minimum duration that supersedes (a) in order to ensure acquisition of a sufficient number of time samples for gesture detection, or to avoid possibly early, false determinations of trigger cessation. Once the gesture detection ends, the HMD may return to a state in which it only monitors for a trigger event (e.g., onset of the trigger condition), but does not necessarily compute the magnetic field time derivative or attempt to identify a gesture.

In further accordance with example embodiments, stored (or cataloged) gestures may be generated as part of a "learning" procedure, whereby a wearer of the HMD provides a first input to start a recording interval for "recording," makes a personalized or customize hand gesture while wearing the HWM, and then provides a second input to stop recording and end the recording interval. The recording action may thereby record the derivative of the magnetic field vectors as measured from the customized hand gesture during the recording interval. The wearer can thereafter associate the recorded derivatives with a particular gesture (e.g., a gesture identifier, a command, an application, etc.). By repeating this procedure for different gestures, the wearer may build up a library or catalog of known gestures for future use.

In still further accordance with example embodiments, the HMD will may include one or more motion detectors that provide translational and rotational motion measurements of the HMD. A motion detector could include one or more accelerometers, one or more gyroscopes, a location detection system (e.g., a GPS system), some or all of which could be configured as an inertial measurement unit (IMU). A motion detector could also include a video camera, whereby analysis of video data could detect and measure motion in the form of optical flow. The information from a motion detector can be used to compensate for HMD motion during magnetometer-based gesture detection. For example, if a wearer of the HMD is in a moving vehicle that is rapidly changing orientation with respect to the geomagnetic field (e.g., moving in a circle), detection of this motion by the motion detector could be used to disable the trigger, and hence cause the HMD to ignore any spurious signal that might otherwise be taken for presence and motion of the HWM in the gesture detection region. As a further example, if a wearer of the HMD is moving his/her head while making a gesture, spurious (i.e., non-gesture) relative motion between the HMD and the HWM could be introduced, thereby causing failure to correctly detect a gesture. Motion detector measurements of the head motion could be used to compensate for the spurious relative motion, and enable correct gesture detection in this circumstance. As a still further example, intentional movement of the HMD with respect to a background field may be used to signal the start of a gesture detection window.

In further accordance with example embodiments, the magnetometer device could include two or more three-axis magnetometers. Combining measurements from multiple magnetometers could increase the precision, accuracy, and reliability of detected presence and motion of the HWM in the gesture detection region, leading to improved performance. Furthermore, with multiple magnetometers a relative distance between the HMD and the HWM can be determined, allowing determination of a trajectory of the motion of the HWM. Such information could increase the usefulness of gestures. For instance, a virtual line could be drawn between two spatial points, or a virtual cursor or pointer could be invoked as free-space gesture. Other more complex gestures could be devised as well.

In yet further accordance with example embodiments, an HMD can be communicatively connected with a communication network, and can exchange data with a server or server system (other device) in the network. Multiple HMDs in a network could also exchange data. In still further accordance with example embodiments, applications and/or commands invoked by hand gestures could involve communication with a server or server system or with one or more other HMDs in the communication network. For example, a hand gesture could cause a program running on the wearable HMD to upload and/or download content (e.g., media data) to/from the server or other HMD.

In accordance with example embodiments, the HWM could be in the form of a ring, or other hand-worn jewelry. The HWM could also be in the form of a magnetic decal affixed to one or more fingernails, or one or more magnetized artificial fingernails. Combining a multiple-finger HWM with one or more three-axis magnetometers could allow recognition of complex gestures involving combined motions of two or more fingers, in addition to bulk hand motion. Moreover, the HWM could take the form of a fashionable or stylish adornment having potential marketing value beyond its function in gesture sensing by the magnetometer device.

2. Example Systems and Network a. Example Wearable Computing System

In accordance with an example embodiment, a wearable computing system may comprise various components, including one or more processors, one or more forms of memory, one or more sensor devices, one or more I/O devices, one or more communication devices and interfaces, and a head-mounted display (HMD), all collectively arranged in a manner to make the system wearable by a user. The wearable computing system may also include machine-language logic (e.g., software, firmware, and/or hardware instructions) stored in one or another form of memory and executable by one or another processor of the system in order to implement one or more programs, tasks, applications, or the like. The wearable computing system may be configured in various form factors, including, without limitation, integrated in the HMD as a unified package, or distributed, with one or more elements integrated in the HMD and one or more others separately wearable (e.g., as a garment, in a garment pocket, as jewelry, etc.).

Although described above as a component of a wearable computing system, it is sometimes convenient to consider an HMD to be (or at least to represent) the wearable computing system. Accordingly, unless otherwise specified, the terms "wearable head-mounted display" (or "wearable HMD") or just "head-mounted display" (or "HMD") will be used herein to refer to a wearable computing system, in either an integrated (unified package) form, a distributed (or partially distributed) form, or other wearable form.

FIG. 1a illustrates an example wearable computing system 100 for receiving, transmitting, and displaying data. In accordance with an example embodiment, the wearable computing system 100 is depicted as a wearable HMD taking the form of eyeglasses 102. However, it will be appreciated that other types of wearable computing devices could additionally or alternatively be used, including a monocular display configuration having only one lens-display element.

As illustrated in FIG. 1a, the eyeglasses 102 comprise frame elements including lens-frames 104 and 106 and a center frame support 108, lens elements 110 and 112, and extending side-arms 114 and 116. The center frame support 108 and the extending side-arms 114 and 116 are configured to secure the eyeglasses 102 to a user's face via a user's nose and ears, respectively. Each of the frame elements 104, 106, and 108 and the extending side-arms 114 and 116 may be formed of a solid structure of plastic or metal, or may be formed of a hollow structure of similar material so as to allow wiring and component interconnects to be internally routed through the eyeglasses 102. Each of the lens elements 110 and 112 may include a material on which an image or graphic can be displayed, either directly or by way of a reflecting surface. In addition, at least a portion of each lens elements 110 and 112 may be sufficiently transparent to allow a user to see through the lens element. These two features of the lens elements could be combined; for example, to provide an augmented reality or heads-up display where the projected image or graphic can be superimposed over or provided in conjunction with a real-world view as perceived by the user through the lens elements.

The extending side-arms 114 and 116 are each projections that extend away from the frame elements 104 and 106, respectively, and are positioned behind a user's ears to secure the eyeglasses 102 to the user. The extending side-arms 114 and 116 may further secure the eyeglasses 102 to the user by extending around a rear portion of the user's head. Additionally or alternatively, the wearable computing system 100 may be connected to or be integral to a head-mounted helmet structure. Other possibilities exist as well.

The wearable computing system 100 may also include an on-board computing system 118, a video camera 120, a sensor 122, a finger-operable touch pad 124, and a communication interface 126. The on-board computing system 118 is shown to be positioned on the extending side-arm 114 of the eyeglasses 102; however, the on-board computing system 118 may be provided on other parts of the eyeglasses 102. The on-board computing system 118 may include, for example, a one or more processors and one or more forms of memory. The on-board computing system 118 may be configured to receive and analyze data from the video camera 120, the sensor 122, the finger-operable touch pad 124, and the wireless communication interface 126 (and possibly from other sensory devices and/or user interfaces) and generate images for output to the lens elements 110 and 112.

The video camera 120 is shown to be positioned on the extending side-arm 114 of the eyeglasses 102; however, the video camera 120 may be provided on other parts of the eyeglasses 102. The video camera 120 may be configured to capture images at various resolutions or at different frame rates. Video cameras with a small form factor, such as those used in cell phones or webcams, for example, may be incorporated into an example of the wearable system 100. Although FIG. 1a illustrates one video camera 120, more video cameras may be used, and each may be configured to capture the same view, or to capture different views. For example, the video camera 120 may be forward facing to capture at least a portion of a real-world view perceived by the user. This forward facing image captured by the video camera 120 may then be used to generate an augmented reality where computer generated images appear to interact with the real-world view perceived by the user.

The sensor 122 may be used to measure and/or determine location, orientation, and motion information, for example. Although represented as a single component mounted on the extending side-arm 116 of the eyeglasses 102, the sensor 122 could in practice include more than one type of sensor device or element provided on one or more different parts of the eyeglasses 102.

By way of example and without limitation, the sensor 122 could include one or more of motion detectors (e.g., one or more gyroscopes and/or accelerometers), one or more magnetometers, and a location determination device (e.g., a GPS device). Gyroscopes, accelerometers, and magnetometers may be integrated into what is conventionally called an "inertial measurement unit" (IMU). An IMU may, in turn, be part of an "attitude heading reference system" (AHRS) that computes (e.g., using the on-board computing system 118) a pointing direction of the HMD from IMU sensor data, possibly together with location information (e.g., from a GPS device). Accordingly, the sensor 122 could include or be part of an AHRS. Other sensing devices or elements may be included within the sensor 122 and other sensing functions may be performed by the sensor 122. Additional details regarding magnetometers and magnetometer operation in connection with gesture detection and recognition are discussed below.

The finger-operable touch pad 124, shown mounted on the extending side-arm 114 of the eyeglasses 102, may be used by a user to input commands. The finger-operable touch pad 124 may sense at least one of a position and a movement of a finger via capacitive sensing, resistance sensing, or a surface acoustic wave process, among other possibilities. The finger-operable touch pad 124 may be capable of sensing finger movement in a direction parallel to the pad surface, in a direction normal to the pad surface, or both, and may also be capable of sensing a level of pressure applied. The finger-operable touch pad 124 may be formed of one or more translucent or transparent insulating layers and one or more translucent or transparent conducting layers. Edges of the finger-operable touch pad 124 may be formed to have a raised, indented, or roughened surface, so as to provide tactile feedback to a user when the user's finger reaches the edge of the finger-operable touch pad 124. Although not shown in FIG. 1a, the eyeglasses 102 could include one more additional finger-operable touch pads, for example attached to the extending side-arm 316, which could be operated independently of the finger-operable touch pad 124 to provide a duplicate and/or different function.

The communication interface 126 could include an antenna and transceiver device for support of wireline and/or wireless communications between the wearable computing system 100 and a remote device or communication network. For instance, the communication interface 126 could support wireless communications with any or all of 3G and/or 4G cellular radio technologies (e.g., CDMA, EVDO, GSM, UMTS, LTE, WiMAX), as well as wireless local or personal area network technologies such as a Bluetooth, Zigbee, and WiFi (e.g., 802.11a, 802.11b, 802.11g). Other types of wireless access technologies could be supported as well. The communication interface 126 could enable communications between the wearable computing system 100 and one or more end devices, such as another wireless communication device (e.g., a cellular phone or another wearable computing device), a user at a computer in a communication network, or a server or server system in a communication network. The communication interface 126 could also support wired access communications with Ethernet or USB connections, for example.

FIG. 1b illustrates another view of the wearable computing system 100 of FIG. 1a. As shown in FIG. 1b, the lens elements 110 and 112 may act as display elements. In this regard, the eyeglasses 102 may include a first projector 128 coupled to an inside surface of the extending side-arm 116 and configured to project a display image 132 onto an inside surface of the lens element 112. Additionally or alternatively, a second projector 130 may be coupled to an inside surface of the extending side-arm 114 and configured to project a display image 134 onto an inside surface of the lens element 110.

The lens elements 110 and 112 may act as a combiner in a light projection system and may include a coating that reflects the light projected onto them from the projectors 128 and 130. Alternatively, the projectors 128 and 130 could be scanning laser devices that interact directly with the user's retinas.

A forward viewing field may be seen concurrently through lens elements 110 and 112 with projected or displayed images (such as display images 132 and 134). This is represented in FIG. 1b by the field of view (FOV) object 136-L in the left lens element 112 and the same FOV object 136-R in the right lens element 110. The combination of displayed images and real objects observed in the FOV may be one aspect of augmented reality, referenced above. In addition, images could be generated for the right and left lens elements produce a virtual three-dimensional space when right and left images are synthesized together by a wearer of the HMD. Virtual objects could then be made to appear to be located in and occupy the actual three-dimensional space viewed transparently through the lenses.

In alternative embodiments, other types of display elements may also be used. For example, lens elements 110, 112 may include: a transparent or semi-transparent matrix display, such as an electroluminescent display or a liquid crystal display; one or more waveguides for delivering an image to the user's eyes; and/or other optical elements capable of delivering an in focus near-to-eye image to the user. A corresponding display driver may be disposed within the frame elements 104 and 106 for driving such a matrix display. Alternatively or additionally, a scanning laser device, such as low-power laser or LED source and accompanying scanning system, can draw a raster display directly onto the retina of one or more of the user's eyes. The user can then perceive the raster display based on the light reaching the retina.

Although not shown in FIGS. 1a and 1b, the wearable system 100 can also include one or more components for audio output. For example, wearable computing system 100 can be equipped with speaker(s), earphone(s), and/or earphone jack(s). Other possibilities exist as well.

While the wearable computing system 100 of the example embodiment illustrated in FIGS. 1a and 1b is configured as a unified package, integrated in the HMD component, other configurations are possible as well. For example, although not explicitly shown in FIGS. 1a and 1b, the wearable computing system 100 could be implemented in a distributed architecture in which all or part of the on-board computing system 118 is configured remotely from the eyeglasses 102. For example, some or all of the on-board computing system 118 could be made wearable in or on clothing as an accessory, such as in a garment pocket or on a belt clip. Similarly, other components depicted in FIGS. 1a and/or 1b as integrated in the eyeglasses 102 could also be configured remotely from the HMD component. In such a distributed architecture, certain components might still be integrated in HMD component. For instance, one or more sensors (e.g., a magnetometer, gyroscope, etc.) could be integrated in eyeglasses 102.

In an example distributed configuration, the HMD component (including other integrated components) could communicate with remote components via the communication interface 126 (or via a dedicated connection, distinct from the communication interface 126). By way of example, a wired (e.g. USB or Ethernet) or wireless (e.g., WiFi or Bluetooth) connection could support communications between a remote computing system and a HMD component. Additionally, such a communication link could be implemented between a HMD component and other remote devices, such as a laptop computer or a mobile telephone, for instance.

FIG. 2 is a block diagram depicting functional components of an example wearable computing system 202 in accordance with an example embodiment. As shown in FIG. 2, the example wearable computing system 202 includes one or more processing units 204, data storage 206, transceivers 212, communication interfaces 214, user input/output (I/O) devices 216, and sensor devices 228, all of which may be coupled together by a system bus 238 or other communicative interconnection means. These components may be arranged to support operation in accordance with an example embodiment of a wearable computing system, such as system 100 shown in FIGS. 1a and 1b, or other wearable HMD.

The one or more processing units 204 could include one or more general-purpose processors (e.g., INTEL microprocessors) and/or one or more special-purpose processors (e.g., dedicated digital signal processor, application specific integrated circuit, etc.). In turn, the data storage 206 could include one or more volatile and/or non-volatile storage components, such as magnetic or optical memory or disk storage. Data storage 206 can be integrated in whole or in part with processing unit 204, as cache memory or registers for instance. As further shown, data storage 206 is equipped to hold program logic 208 and program data 210.

Program logic 208 could include machine language instructions (e.g., software code, firmware code, etc.) that define routines executable by the one or more processing units 204 to carry out various functions described herein. Program data 210 could contain data used or manipulated by one or more applications or programs executable by the one or more processors. Such data can include, among other forms of data, program-specific data, user data, input/output data, sensor data, or other data and information received, stored, retrieved, transmitted, analyzed, or modified in the course of execution of one or more programs or applications.

The transceivers 212 and communication interfaces 214 may be configured to support communication between the wearable computing system 202 and one or more end devices, such as another wireless communication device (e.g., a cellular phone or another wearable computing device), a user at a computer in a communication network, or a server or server system in a communication network. The transceivers 212 may be coupled with one or more antennas to enable wireless communications, for example, as describe above for the wireless communication interface 126 shown in FIG. 1*a*. The transceivers 212 may also be coupled with one or more wireline connectors for wireline communications such as Ethernet or USB. The transceivers 212 and communication interfaces 214 could also be used support communications within a distributed-architecture in which various components of the wearable computing system 202 are located remotely from one another. In this sense, the system bus 238 could include elements and/or segments that support communication between such distributed components.

As shown, the user I/O devices 216 include a camera 218, a display 220, a speaker 222, a microphone 224, and a touchpad 226. The camera 218 could correspond to the video camera 120 described in the discussion of FIG. 1*a* above. Similarly, the display 220 could correspond to an image processing and display system for making images viewable to a user (wearer) of an HMD. The display 220 could include, among other elements, the first and second projectors 128 and 130 coupled with lens elements 112 and 110, respectively, for generating image displays as described above for FIG. 1*b*. The touchpad 226 could correspond to the finger-operable touch pad 124, as described for FIG. 1*a*. The speaker 422 and microphone 224 could similarly correspond to components referenced in the discussion above of FIGS. 1*a* and 1*b*. Each of the user I/O devices 216 could also include a device controller and stored, executable logic instructions, as well as an interface for communication via the system bus 238.

The sensor devices 228, which could correspond to the sensor 122 described above for FIG. 1*a*, include a location sensor 230, a motion sensor 232, one or more magnetometers 234, and an orientation sensor 236. The location sensor 230 could correspond to a Global Positioning System (GPS) device, or other location-determination device (e.g. mobile phone system triangulation device, etc.). The motion sensor 232 could correspond to one or more accelerometers and/or one or more gyroscopes. A typical configuration may include three accelerometers oriented along three mutually orthogonal axes, for example. A similar configuration of three magnetometers can also be used.

The orientation sensor 236 could include or be part of an AHRS for providing theodolite-like functionality for determining an angular orientation of a reference pointing direction of the HMD with respect to a local terrestrial coordinate system. For instance, the orientation sensor could determine an altitude angle with respect to horizontal and an azimuth angle with respect to a reference directions, such as geographic (or geodetic) North, of a forward pointing direction of the HMD. Other angles and coordinate systems could be used as well for determining orientation.

The magnetometer 234 (or magnetometers) could be used to determine the strength and direction of the Earth's magnetic (geomagnetic) field as measured at a current location of the HMD. As described in detail below, the magnetometer (or magnetometers) could also be used to detect presence and motion of a hand-wearable magnet in order to recognize hand gestures.

Each of the sensor devices 228 could also include a device controller and stored, executable logic instructions, as well as an interface for communication via the system bus 238.

It will be appreciated that there can be numerous specific implementations of a wearable computing system or wearable HMD, such as the wearable computing system 202 illustrated in FIG. 2. Further, one of skill in the art would understand how to devise and build such an implementation.

b. Example Network

In an example embodiment, an HMD can support communications with a network and with devices in or communicatively connected with a network. Such communications can include exchange of information between the HMD and another device, such as another connected HMD, a mobile computing device (e.g., mobile phone or smart phone), or a server. Information exchange can support or be part of services and/or applications, including, without limitation, uploading and/or downloading content (e.g., music, video, etc.), and client-server communications, among others.

Figure 3:
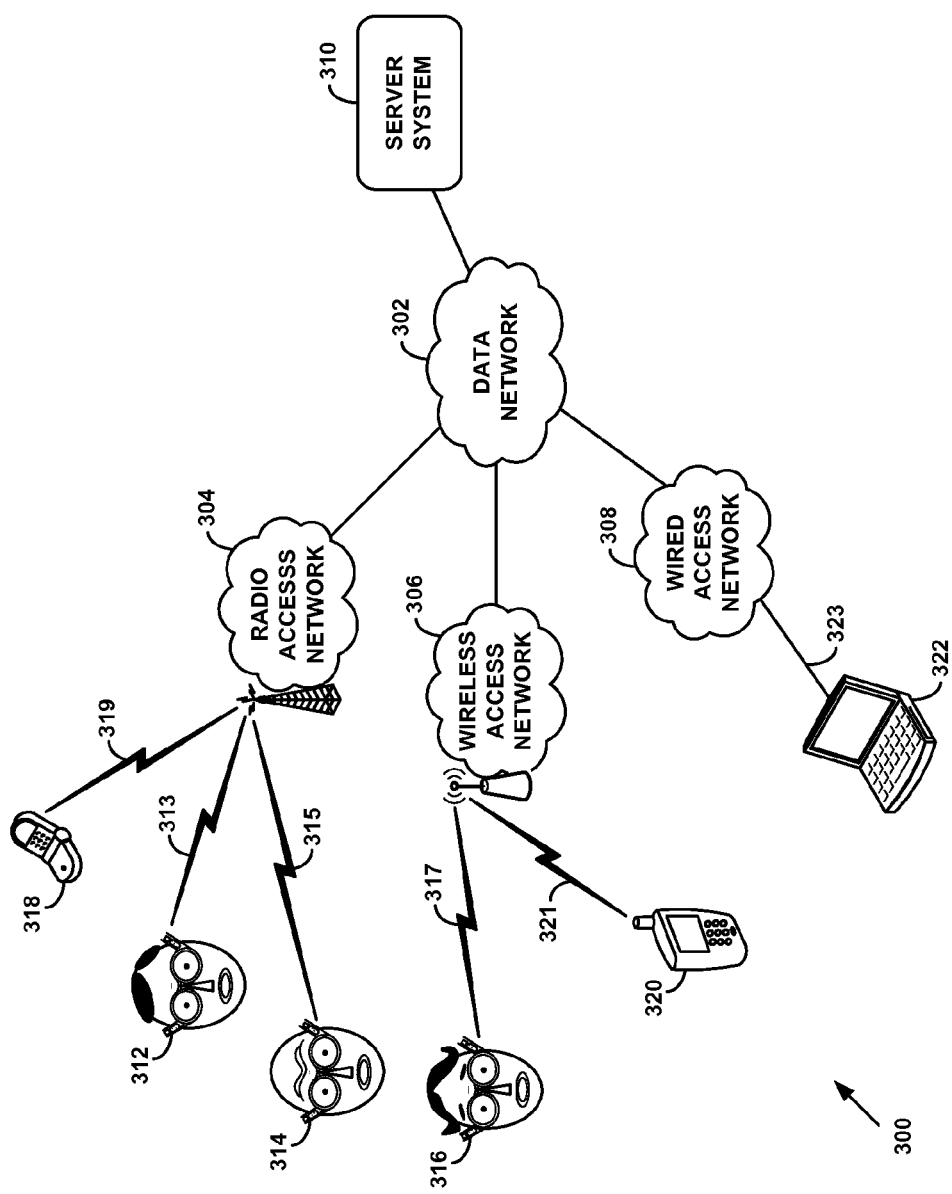
FIG. 3 is a simplified block diagram of a communication network, in accordance with an example embodiment.

FIG. 3 illustrates one view of a network 300 in which one or more HMDs could engage in communications. As depicted, the network 300 includes a data network 302 that is connected to each of a radio access network (RAN) 304, a wireless access network 306, and a wired access network 308. The data network 302 could represent the one or more interconnected communication networks, such as or including the Internet. The radio access network 304 could represent a service provider's cellular radio network supporting, for instance, 3G and/or 4G cellular radio technologies (e.g., CDMA, EVDO, GSM, UMTS, LTE, WiMAX). The wireless access network 306 could represent a residential or hot-spot wireless area network supporting, such as, Bluetooth, ZigBee, and WiFi (e.g., 802.11a, 802.11b, 802.11g). The wired access network 308 could represent a residential or commercial local area network supporting, for instance, Ethernet.

The network 300 also includes a server system 310 connected to the data network 302. The server system 310 could represent a website or other network-based facility for providing one or another type of service to users. For instance, in accordance with an example embodiment, the server system 310 could host an online social networking service or website. As another example, the server system 310 could provide a network-based information search service.

FIG. 3 also shows various end-user and/or client devices connected to the network 300 via one of the three access networks. By way of example, an HMD 312 is connected to the RAN 304 via an air interface 313 (e.g., a 3G or 4G technology), and an HMD 314 is connected to the RAN 304 via an air interface 315 (e.g., a 3G or 4G technology). Also by way of example, an HMD 316 is connected to the wireless access network 306 via an air interface 317 (e.g., a WiFi technology). In addition and also by way of example, a mobile phone 318 is shown connected to the RAN 304 via an air interface 319, a smart phone 320 is shown connected to the wireless access network 306 via an air interface 321, and a laptop computer 322 is shown connected to the wired access network 308 via a wired interface 323. Each of the end-user devices could communicate with one or another network-connected device via its respective connection with the network. It could be possible as well for some of these end-user devices to communicate directly with each other (or other end-user devices not shown).

Each of the HMDs 312, 314, and 316 is depicted as being worn by different user (each user being represented by a cartoon face) in order to signify possible user-related variables, circumstances, and applications that may be associated with each HMD. For instance, the HMD 312 could at one time upload content to an online social networking service, whereas the HMD 314 could at the same or another time send a request to a network-based information search service. Users could interact with each other and/or with the network via their respective HMDs, and in turn use magnetically-sensed hand gestures as one of multiple possible user interfaces with their respective HMDs. Other examples are possible as well. For the purposes of most of the discussion herein it is usually sufficient to reference only an HMD without referencing the user (or wearer) of the HMD. Explicit reference to or discussion of a user (or wearer) of an HMD will be made as necessary.

c. Example Server System

Figure 4A:
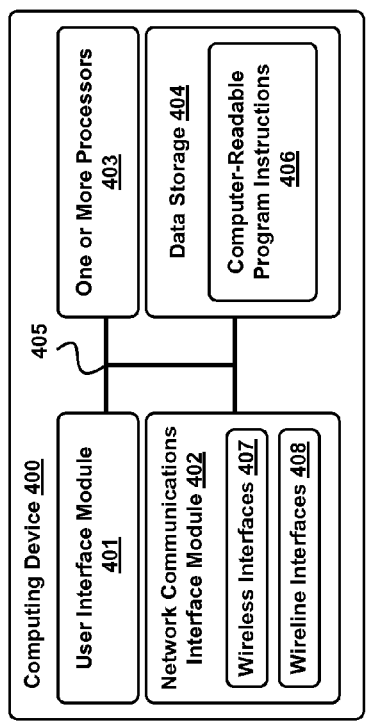
FIG. 4a is a block diagram of a computing device, in accordance with an example embodiment.
Figure 4B:
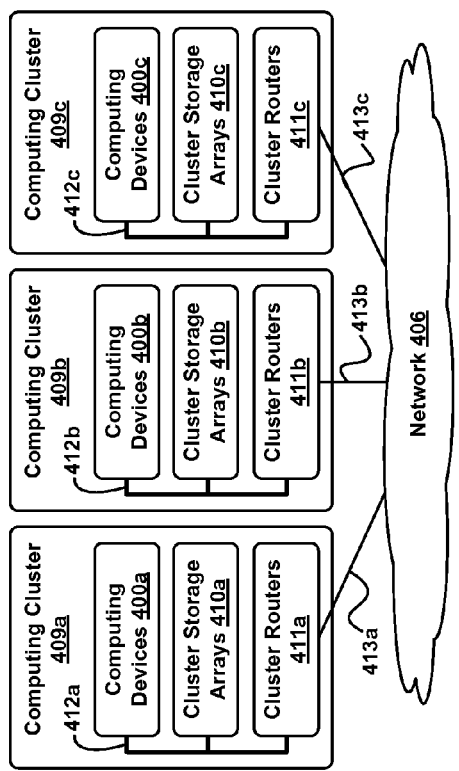
FIG. 4b depicts a network with clusters of computing devices of the type shown in FIG. 4a, in accordance with an example embodiment.

A network server, such as the server system 310 in FIG. 3, could take various forms and be implemented in one or more different ways. FIGS. 4a and 4b illustrate two example embodiments of a server system: an integrated system including a representative computing device (FIG. 4a), and a distributed system (FIG. 4b) including multiple representative computing devices, as well as additional system elements, communicatively connected together.

FIG. 4a is a block diagram of a computing device 400 in accordance with an example embodiment. The computing device 400 can include a user interface module 401, a network-communication interface module 402, one or more processors 403, and data storage 404, all of which can be linked together via a system bus, network, or other connection mechanism 405.

The user interface module 401 can be operable to send data to and/or receive data from external user input/output devices. For example, the user interface module 401 can be configured to send/receive data to/from user input devices such as a keyboard, a keypad, a touch screen, a computer mouse, a track ball, a joystick, and/or other similar devices, now known or later developed. The user interface module 401 can also be configured to provide output to user display devices, such as one or more cathode ray tubes (CRT), liquid crystal displays (LCD), light emitting diodes (LEDs), displays using digital light processing (DLP) technology, printers, light bulbs, and/or other similar devices, now known or later developed. The user interface module 401 can also be configured to generate audible output(s), such as a speaker, speaker jack, audio output port, audio output device, earphones, and/or other similar devices, now known or later developed.

The network-communications interface module 402 can include one or more wireless interfaces 407 and/or wireline interfaces 408 that are configurable to communicate via a network, such as the network 302 shown in FIG. 3. The wireless interfaces 407 can include one or more wireless transceivers, such as a Bluetooth transceiver, a Wi-Fi transceiver perhaps operating in accordance with an IEEE 802.11 standard (e.g., 802.11a, 802.11b, 802.11g), a WiMAX transceiver perhaps operating in accordance with an IEEE 802.16 standard, and/or other types of wireless transceivers configurable to communicate via a wireless network. The wireline interfaces 408 can include one or more wireline transceivers, such as an Ethernet transceiver, a Universal Serial Bus (USB) transceiver, or similar transceiver configurable to communicate via a wire, a twisted pair of wires, a coaxial cable, an optical link, a fiber-optic link, or other physical connection to a wireline network.

In some embodiments, the network communications interface module 402 can be configured to provide reliable, secured, compressed, and/or authenticated communications. For each communication described herein, information for ensuring reliable communications (e.g., guaranteed message delivery) can be provided, perhaps as part of a message header and/or footer (e.g., packet/message sequencing information, encapsulation header(s) and/or footer(s), size/time information, and transmission verification information such as cyclic redundancy check (CRC) and/or parity check values). Communications can be compressed and decompressed using one or more compression and/or decompression algorithms and/or protocols such as, but not limited to, one or more lossless data compression algorithms and/or one or more lossy data compression algorithms. Communications can be made secure (e.g., be encoded or encrypted) and/or decrypted/decoded using one or more cryptographic protocols and/or algorithms, such as, but not limited to, DES, AES, RSA, Diffie-Hellman, and/or DSA. Other cryptographic protocols and/or algorithms can be used as well or in addition to those listed herein to secure (and then decrypt/decode) communications.

The one or more processors 403 can include one or more general purpose processors and/or one or more special purpose processors (e.g., digital signal processors, application specific integrated circuits, etc.). The one or more processors 403 can be configured to execute computer-readable program instructions 406 that are contained in the data storage 404 and/or other instructions as described herein.

The data storage 404 can include one or more computer-readable storage media that can be read or accessed by at least one of the processors 403. The one or more computer-readable storage media can include volatile and/or non-volatile storage components, such as optical, magnetic, organic or other memory or disc storage, which can be integrated in whole or in part with at least one of the one or more processors 403. In some embodiments, the data storage 404 can be implemented using a single physical device (e.g., one optical, magnetic, organic or other memory or disc storage unit), while in other embodiments, the data storage 404 can be implemented using two or more physical devices.

Computer-readable storage media associated with data storage 404 and/or other computer-readable media described herein can also include non-transitory computer-readable media such as computer-readable media that stores data for short periods of time like register memory, processor cache, and random access memory (RAM). Computer-readable storage media associated with data storage 404 and/or other computer-readable media described herein can also include non-transitory computer readable media that stores program code and/or data for longer periods of time, such as secondary or persistent long term storage, like read only memory (ROM), optical or magnetic disks, compact-disc read only memory (CD-ROM), for example. Computer-readable storage media associated with data storage 404 and/or other computer-readable media described herein can also be any other volatile or non-volatile storage systems. Computer-readable storage media associated with data storage 404 and/or other computer-readable media described herein can be considered computer readable storage media for example, or a tangible storage device.

The data storage 404 can include computer-readable program instructions 406 and perhaps additional data. In some embodiments, the data storage 404 can additionally include storage required to perform at least part of the herein-described techniques, methods, and/or at least part of the functionality of the herein-described devices and networks.

FIG. 4b depicts a network 406 with computing clusters 409a, 409b, and 409c in accordance with an example embodiment. In FIG. 4b, functions of a network server, such as the server system 310 in FIG. 3, can be distributed among three computing clusters 409a, 409b, and 408c. The computing cluster 409a can include one or more computing devices 400a, cluster storage arrays 410a, and cluster routers 411a, connected together by local cluster network 412a. Similarly, computing cluster 409b can include one or more computing devices 400b, cluster storage arrays 410b, and cluster routers 411b, connected together by local cluster network 412b. Likewise, computing cluster 409c can include one or more computing devices 400c, cluster storage arrays 410c, and cluster routers 411c, connected together by a local cluster network 412c.

In some embodiments, each of computing clusters 409a, 409b, and 409c can have an equal number of computing devices, an equal number of cluster storage arrays, and an equal number of cluster routers. In other embodiments, however, some or all of computing clusters 409a, 409b, and 409c can have different numbers of computing devices, different numbers of cluster storage arrays, and/or different numbers of cluster routers. The number of computing devices, cluster storage arrays, and cluster routers in each computing cluster can depend on the computing task or tasks assigned to each computing cluster.

Cluster storage arrays 410a, 410b, and 410c of computing clusters 409a, 409b, and 409c can be data storage arrays that include disk array controllers configured to manage read and write access to groups of hard disk drives. The disk array controllers, alone or in conjunction with their respective computing devices, can also be configured to manage backup or redundant copies of the data stored in the cluster storage arrays to protect against disk drive or other cluster storage array failures and/or network failures that prevent one or more computing devices from accessing one or more cluster storage arrays.

The cluster routers 411a, 411b, and 411c in the computing clusters 409a, 409b, and 409c can include networking equipment configured to provide internal and external communications for the computing clusters. For example, the cluster routers 411a in the computing cluster 409a can include one or more internet switching and/or routing devices configured to provide (i) local area network communications between the computing devices 400a and the cluster storage arrays 401a via the local cluster network 412a, and/or (ii) wide area network communications between the computing cluster 409a and the computing clusters 409b and 409c via the wide area network connection 413a to the network 406. The cluster routers 411b and 411c can include network equipment similar to the cluster routers 411a, and the cluster routers 411b and 411c can perform similar networking functions for the computing clusters 409b and 409b that the cluster routers 411a perform for the computing cluster 409a.

3. Gesture Recognition with a Magnetometer Device

Example embodiments of magnetometer-based gesture sensing with a magnetometer-equipped HMD may be described in terms of operation by considering representative use of an example HMD and an example hand-wearable magnet (HWM). For purposes of illustration, a HMD, such as the wearable computing device 100 of FIG. 1, that includes a magnetometer device, as well as a HWM, may be taken as being worn by representative user. Also for illustrative purposes, the HWM may be taken to be a magnetic ring or a ring bearing a magnetic element. By way of example, the magnetic element (or ring) may be considered a dipole magnet, unless otherwise specified. It will be appreciated that hand-wearable magnets with different form factors may also be used (e.g, other jewelry), and that magnetic elements with higher-order multipoles may be employed. In illustrative operation, the HWM can be used by the representative user to facilitate user interaction with the HMD, as described below.

In accordance with example embodiments, a magnetometer device may include a magnetometer for measuring local magnetic field. The magnetometer device could also include additional components, such as a power supply, an interface for connecting and communicating with the HMD, and a processor for carrying out various computational functions (such as ones discussed below) and/or control functions (such as determining modes of operation, setting adjustable parameters, etc.). Alternatively, these and possibly other, additional components and functions could be integrated with the magnetometer, in which case the magnetometer and the magnetometer device could be considered one and the same. In still an alternative configuration, the magnetometer device could include more than one magnetometer, or multiple single-magnetometer devices could be used, as discussed later in more detail.

a. Operational States

In accordance with example embodiments, the magnetometer of a HMD may continuously monitor and measure a local magnetic field, and the HMD could recognize a particular gesture of a hand bearing a HWM by analyzing the effect of gesture-related motion of the HWM on the local magnetic field measured by the magnetometer. In typical usage scenarios, hand gestures may be carried out as transient actions within a localized "gesture detection region" of space near the HMD (e.g., within a spherical volume of roughly an arm's length radius, centered at the HMD). Beyond the gesture detection region, the HWM may be largely undetectable by the magnetometer. Hence, in the context of detection and measurement of the HWM by the magnetometer, hand gestures may be viewed as transient magnetic disturbances against a background magnetic field. Accordingly, the HMD may be configured to detect and respond to such transient magnetic disturbances.

In further accordance with example embodiments, the HMD may be configured to operate in different states with respect to magnetometer-based gesture recognition. More particularly, the HMD may operate in a background detection state in order to determine an initial baseline level of local magnetic field strength. While operating in the background detection state, the HMD may also anticipate hand gestures by monitoring for magnetic disturbances attributable to presence and motion of the HWM within a threshold distance of the magnetometer. Upon occurrence of a trigger event corresponding to magnetic disturbance above a threshold level, the HMD may then transition to operating in a gesture detection state. While operating in the gesture detection state, the HMD may analyze measurements from the magnetometer in order to determine if they correspond to a known gesture. If so, the HMD may then carry out one or more actions based on the now-recognized known gesture. For example, the HMD could carry out a user command associated with the known gesture.

As described below, analysis of magnetometer measurements during operation in the gesture detection state may include comparison of the analyzed measurements with stored information associated with known gestures. In further accordance with example embodiments, the stored information may be generated by way of a "gesture learning" procedure for creating new, known gestures, and recording them on the HMD (e.g., in program data 208 illustrated in FIG. 2). Also in accordance with example embodiments, the HMD may further be configured to operate in a gesture recording state, during which the gesture learning procedure may be carried out.

Details of the background detection state, the gesture detection state, and the gesture recording state, as well as of conditions for transitions between states, are discussed below.

b. Magnetometer Measurement and Operation

In accordance with example embodiments, the magnetometer may be a three-axis magnetometer for measuring local magnetic field along each of three orthogonal axes. For brevity, the term "three-axis" will dropped in the following discussion, but will be understood to apply to the term "magnetometer" hereinafter unless otherwise indicated. By way of example, the three orthogonal axes will be taken to be $\hat{x}$, $\hat{y}$, and $\hat{z}$ of a rectangular coordinate system referenced to (i.e., fixed to) the magnetometer. As such, the magnetometer can be configured to measure a magnetic field vector $\vec{H} = [H_x, H_y, H_z]$, where $H_x$, $H_y$, and $H_z$ are the vector components of $\vec{H}$ along $\hat{z}$, y, and $\hat{z}$, respectively. For any given measurement, a magnitude h of the magnetic field (i.e., magnetic field "strength") can be calculated as:

$$h \equiv \|\vec{H}\| = \sqrt{H_x^2 + H_y^2 + H_z^2} . \tag{1}$$

In further accordance with example embodiments, the magnetometer may be configured to measure magnetic field in successive samples at discrete sampling times $t_i$, i=1, 2, ..., M, where for the moment, M is an arbitrary integer. In notational terms, $\vec{H}_i = [(H_x)_i, (H_y)_i, (H_z)_i]$, where $(H_x)_i$, $(H_y)_i$, and $(H_z)_i$, are the vector components of the field sampled at $t_i$, i=1, 2, ..., M. A field magnitude $h_i$ may be determined for each sample by applying equation (1) at each sample time $t_i$, i=1, 2, ..., M.

In still further accordance with example embodiments, the discrete sampling times $t_i$ are regular, such that $\Delta t = t_{i-1} - t_i$ is the same for all i. Conventionally, $\Delta t$ is referred to as the sampling interval, and $1/\Delta t$ is referred to as the sampling frequency. In accordance with example embodiments, sampling intervals in the range 10-20 msec (0.01-0.02 seconds) may be used, corresponding to sampling frequencies in the range 50-100 Hz (1 Hz=1 cycle per second). It will be appreciated that sampling intervals outside of this range are possible as well. In practice, each sample may correspond to an accumulation (e.g., a time average) of a continuous measurement of $\vec{H}_i$ over the duration of $\Delta t$.

Also in accordance with example embodiments, the magnetometer could be configured to provide each $\vec{H}_i$ sample to the HMD (e.g., via an integrated interface or an interface component of the magnetometer device), which in turn could compute each $h_i$. Alternatively, the magnetometer (or magnetometer device) could include functionality to compute each $h_i$. Additional functions of the magnetometer and/or magnetometer device could include adjustment of $\Delta t$ and/or other operational parameters.

c. Background Determination and Background Detection State

In typical operational settings of a HMD (e.g., as worn by a representative user), the primary source of background magnetic field will be the Earth's magnetic field (geomagnetic field). While the direction of the geomagnetic field measured by the magnetometer will depend on the orientation of magnetometer (i.e., of the three measurement axes $\hat{x}$, $\hat{y}$, and $\hat{z}$) with respect to a coordinate system fixed to the Earth, the magnitude of the geomagnetic field at a given location does not. In addition, the magnitude of the geomagnetic field generally varies sufficiently slowly with location that it may be considered nearly constant over roughly metropolitan-size regions. Local sources of magnetic field or of magnetic field disturbances (e.g., electrical wires and metal structures) may also contribute to the background, but these generally tend to be weak, contributing mainly as noise to an average background level.

In accordance with example embodiments, the background magnetic field can be determined as a time average of successive samples of field magnitude $h_i$. For N samples at discrete sample times $t_i$, i=1, ..., N, the sample mean field strength $\mu$ is given by:

$$\mu = \frac{1}{N} \sum_{i=1}^{N} h_i . \tag{2a}$$

More generally, for N discrete times $t_i$, i=$N_1$, ..., $N_2$, over a sliding time window $W_{N_1,N_2}$ from $N_1$ to $N_2$, where $N_2 = N_1 + N - 1$, and N≥1, the sample mean field strength $\mu_{N_1,N_2}$ is given by:

$$\mu_{N_1,N_2} = \frac{1}{N} \sum_{i=N_1}^{N_2} h_i . \tag{2b}$$

The sliding window $W_{N_1,N_2}$ corresponds to incrementing both $N_1$ and $N_2$ by k for every k increments of $\Delta t$ in time. For example, for k=1, $W_{N_1,N_2}$ slides $\Delta t$ toward increasing time for each $\Delta t$ of passing time. This gives an adaptive form of the sample mean that updates with increasing time.

It is sometimes convenient to adopt an alternate notation in which the discrete sample times are $t_i$, i=0, ..., N−1, where $t_0$ is taken to be the current time, and in which each increment in the index i corresponds to the next previous (earlier) sample time. In this case, a sliding time window $W_{0,N}$ is referenced to the current time and covers N consecutive samples backwards in time starting from $t_0$. For example, the sample mean at the current time $t_0$ would be given by:

$$\mu_0 = \frac{1}{N}(h_0 + h_{-1} + \ldots + h_{1-N}) = \frac{1}{N} \sum_{i=0}^{N-1} h_{-i} . \tag{2c}$$

A standard deviation $\sigma$ of the sample mean $\mu$ in equation (2a) may be computed as:

$$\sigma = \sqrt{\frac{1}{N-1} \sum_{i=1}^{N} (h_i - \mu)^2} . \tag{3a}$$

For the more general case of the sliding time window $W_{N_1,N_2}$, an adaptive form of the standard deviation $\sigma_{N_1,N_2}$ of the sample mean $\rho_{N_1,N_2}$ in equation (2b) may be computed as:

$$\sigma_{N_1,N_2} = \sqrt{\frac{1}{N-1} \sum_{i=N_1}^{N_2} (h_i - \mu_{N_1,N_2})^2} \ . \quad (3b)$$

In terms of $W_{0,N}$, the standard deviation $\sigma_0$ at $t_0$ may be computed as:

$$\sigma_0 = \sqrt{\frac{1}{N-1} \sum_{i=0}^{N-1} (h_{-i} - \mu_0)^2} \ . \quad (3c)$$

In further accordance with example embodiments, while operating in the background detection state, the HMD can compute $h_i$ from the samples of $\vec{H}_i$ measured by the magnetometer at times $t_i$. The HMD may then compute the sample mean and standard deviation of the field strength (magnitude). More particularly, baseline values of sample mean and standard deviation may be established during a calibration period by acquiring an initial set of M measurements at consecutive times $t_i$ when the HWM is known to not be detected above a threshold level. For example, a user could hold the HWM beyond the threshold distance during the calibration period.

In practice, the accuracy of the baseline values of sample mean and standard deviation may be improved by adopting a calibration period that is long compared with known or expected short-term (e.g., tens of seconds) field disturbances. This corresponds to M>>1. For example, taking $\Delta t=10$ msec, a five-minute calibration period corresponds to M=30,000. During this time, the HMD may be moved about to a number of different locations and oriented in a number of different orientations within a region of expected use. As an example, a user might walk around a room or neighborhood during the calibration period. Note that a precise value of M need not necessarily be specified, so long as M>>1 can be reasonably understood to be satisfied. Thus, a calibration period of "approximately X" minutes could be an adequate specification, so long as "approximately X minutes" could be reasonably understood as being much greater than $\Delta t$ and/or long compared with known or expected short-term field disturbances. By way of example, "approximately X minutes" could be in a range of 5-10 minutes. Other values could be used as well.

In still further accordance with example embodiments, while operating in the background detection state, the HMD will continue to monitor the background magnetic field. More particularly, once the baseline values of sample mean and standard deviation have been established, the HWM may continually update the values to the current time by using ongoing measurements of $\vec{H}_i$ from the magnetometer, and by applying a sliding window as described in equations (2c) and (3c), for example.

The background magnetic field strength, in turn, provides a baseline against which the HWM may at later times be detected as a perturbation. If appropriate conditions are met, as described below, a detected perturbation may serve as a trigger for the HMD to transition to operating in the gesture detection state.

The equations given above, as well as additional ones given below, are mathematical formulae for the various defined quantities (e.g., sample mean, standard deviation). As such, the formulae can be applied as given to calculate any of the defined quantities. It will be appreciated, however, that implementations of mathematical formulae in the form of executable instructions on a processor (or the like) for computational purposes may employ alternative, analogous algorithmic formulations for reasons of efficiency, speed, or other practical considerations. Accordingly, implementations on an example HMD of computations corresponding to any formulae and equations described herein should not be viewed as limited algorithmically only to the exact forms of those formulae and/or equations as given.

d. Trigger Determination

Figure 5:
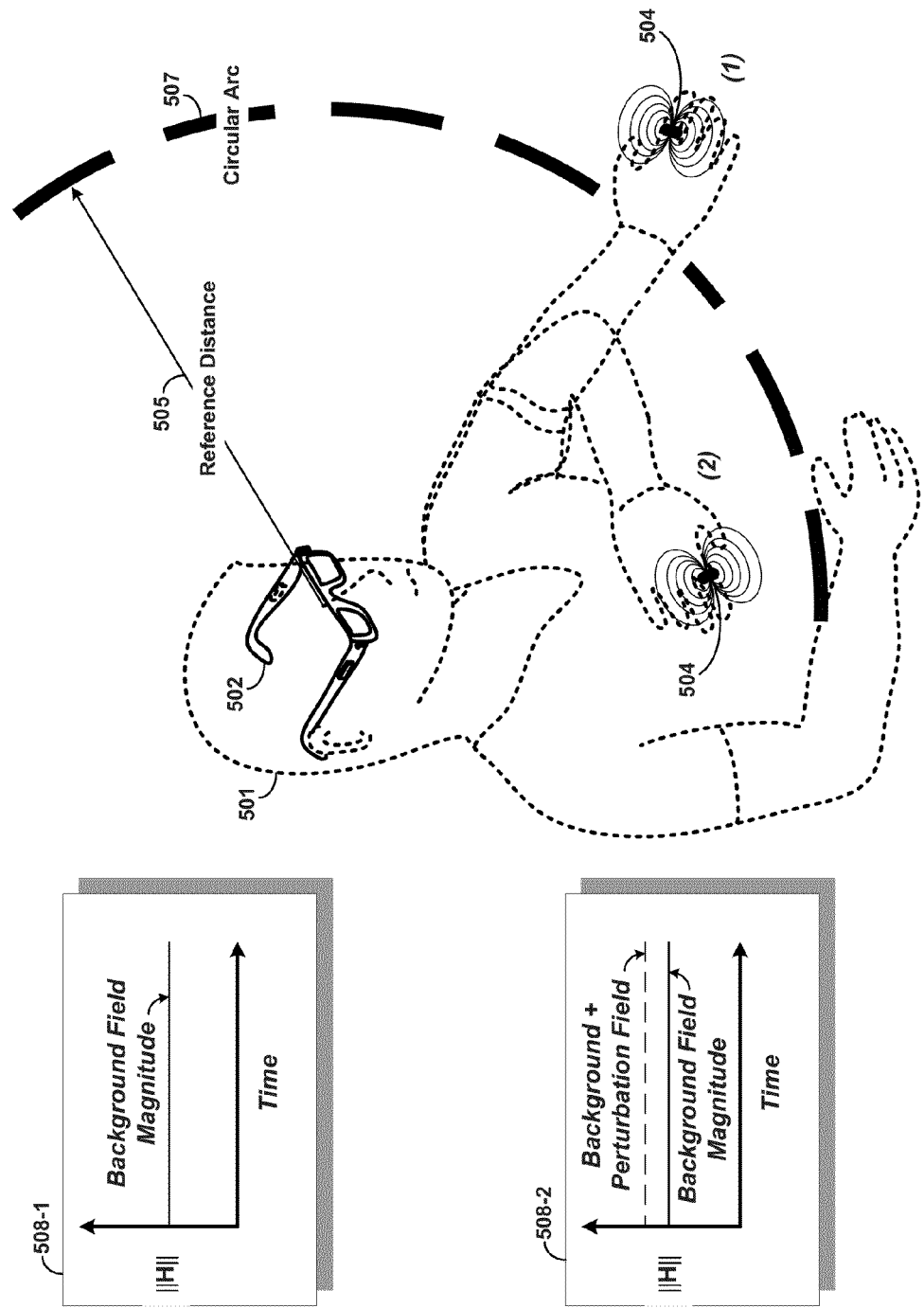
FIG. 5 illustrates an example wearable head-mounted display worn by a representation of an example user who is depicted as also wearing a hand-wearable magnet that may be detected by a magnetometer device of the head-mounted display, according to an example embodiment.

FIG. 5 is a conceptual illustration of the perturbation of the background magnetic field produced by the HWM. A user 501 is depicted as wearing a HWM 502 that is equipped with a magnetometer device (not shown). By way of example, the user 501 is wearing a HWM in the form of a magnetic ring 504 on his left hand. Representative field lines of the ring 504 of a dipole aligned along the user's finger are shown for illustrative purposes only. Also by way of example, a reference distance 505 delineates a spherical volume, represented by circular arc 507, within which a perturbation field caused by the ring 504 makes a detectable contribution to the total field. For purposes of illustration, the reference distance 505 is depicted as measured from the front and center of the HMD 502; in practice a more accurate measure might be referenced to the location of the magnetometer on the HMD 502.

When the user's hand is located beyond the reference distance 505 at the position labeled "(1)," only the background field is detected. This is depicted in the inset 508-1, which represents the magnetic field magnitude $\|H\|$ as function of time (solid horizontal line). When the user's hand is located within the reference distance 505 at the position labeled "(2)," the perturbation field makes a detectable contribution to the total magnetic field magnitude. This is depicted in the inset 508-2, which shows the background magnetic field magnitude $\|H\|$ as function of time, as well as the total of the background magnetic field plus the perturbation field (dashed horizontal line). Note that since the total of the background plus the perturbation fields is a vector sum, the magnitude of the total field could actually be below that of just the background field alone. The depiction in the inset 508-2 of the total field magnitude being greater than that of the background is illustrative.

A trigger condition can occur when the magnitude of the total magnetic field (i.e., the vector sum of the background plus the perturbation fields) differs from that of just the background field by at least a threshold amount. In this case, a perturbation of the background field is said to be greater than a perturbation threshold, and the reference distance 505 may accordingly be considered a threshold distance. Determination of a trigger condition may include not only detection of a perturbation above a perturbation threshold, but also when (and how suddenly) the detected perturbation occurs, and how long it lasts.

In accordance with example embodiments, the HMD may determine the occurrence of a trigger condition by detecting a perturbation of the background magnetic field caused by the HWM. The threshold condition can correspond to the HWM being moved within a threshold distance of the magnetometer, where the threshold distance can be considered a distance within which hand gestures are expected to occur. Hence, occurrence of the trigger condition can signal the start of a gesture, and can therefore be used to cause the HMD to transition to the gesture detection state (described below).

More specifically, for each sample time $t_i$, a deviation $d_i$ of $h_i$ from the sample mean can be determined. By comparing $d_i$ to a threshold deviation $\theta$, a "trigger function" may be defined for each sample time as:

$$\text{Trigger}_i = \begin{cases} 1 & \text{if } d_i > \theta \\ 0 & \text{otherwise} \end{cases}. \quad (4)$$

The deviation $d_i$ can be defined in a number of ways. One example is simply an absolute value of a difference from the sample mean:

$$d_i = |h_i - \mu|. \quad (5)$$

Note that absolute value is used because any given deviation can be above or below the sample mean. In this case, $d_i$ and $\theta$ are in units of magnetic field strength (e.g., Telsa or Gauss). As an alternative, the deviation can be defined as a dimensionless number relative to the standard deviation:

$$d_i = \sqrt{\frac{1}{\sigma^2}(h_i - \mu)^2}. \quad (6)$$

In this case, $d_i$ and $\theta$ are in units of standard deviations. For example, $d_i=3.5$ corresponds to 3.5 standard deviations (i.e., 3.5 σ or "3.5 sigma"). Other forms of deviation $d_i$ could be defined as well, and the example embodiments described herein are not limited only to the two above examples.

For either of the two above example definitions of the deviation, the sample mean against which $h_i$ is compared could take on one of the forms in equations (2a), (2b), or (2c) above. For example, μ as given by equation (2a) corresponds to an assumed constant (or nearly constant) baseline value. Taking μ as given by equations (2b) or (2c) corresponds to an adaptive value of sample mean, as explained above. For the form of $d_i$ given by equation (6), σ could take on one of the forms in equations (3a), (3b), or (3c) above, in which case the characterization of a constant (or nearly constant) baseline value of sample mean versus an adaptive value of sample mean applies to the standard deviation as well.

In further accordance with example embodiments, the form of $d_i$ given by equation (6) will be adopted in evaluating the trigger function of equation (4). Thus, the perturbation threshold may be written as $\theta \times \sigma$. As such, the HMD may determine an occurrence of a trigger by determining at least one occurrence of $d_j > \theta \times \sigma$, or equivalently $\text{Trigger}_j = 1$, at some time $t_{i=j}$. That is, for $t_i$, $i=1, \ldots, K$, there is at least one time $t_{i=j}$, $1 \leq j \leq K$, for which $\text{Trigger}_j = 1$. For purposes of the discussion herein, $\text{Trigger}_i = 1$ for any i will be referred to as a "trigger event."

In order to help reduce or eliminate instances of spurious detections of perturbations above the threshold that can lead to false triggers, the trigger condition may also include a minimum number of trigger events within times $t_i$, $i=1, \ldots, K$. For example, a trigger condition could correspond to at least p consecutive occurrences of trigger events, where $1 \leq p \leq K$. Alternatively, a trigger condition could correspond to at least any p out of K occurrences of trigger events, where again $1 \leq p \leq K$.

In practice, it is convenient to determine if the onset of a trigger condition occurs at the current time $t_0$ of a sliding time window $W_{0,N}$. For trigger condition determination based on just a single occurrence of a trigger event (i.e., for p=1), this just corresponds to $\text{Trigger}_0 = 1$. For p>1, the determination corresponds to determining at $t_0$ either p consecutive occurrences of trigger events, or any p out of the last K occurrences of trigger events. Both approaches may be illustrated by way of example.

Taking p=3 as an example, a trigger condition at time $t_0$ based on p consecutive occurrences of trigger events corresponds to $\text{Trigger}_j = 1$ for j=0, 1, 2, where $t_1$ and $t_2$ are the next two earlier (consecutive) sample times before $t_0$. In this case, the onset of a trigger condition may be considered as occurring at time $t_0$ (i.e., the time of the third of three consecutive triggers).

Alternatively and again as an example, taking p=3 and K=6 (≤N), a trigger condition at time $t_0$ based on p out of K occurrences of trigger events corresponds to $\text{Trigger}_j = 1$ both for j=0 and for any two additional values of j in the range $1 \leq j \leq 5$, where $t_5$ are the next five earlier (consecutive) sample times before $t_0$. In this case, the onset of a trigger condition may again be considered as occurring at time $t_0$ (i.e., the time of the third of three out of six triggers).

In practice, both p and K are kept small since it is generally desirable to make a trigger determination over a small number of samples compared with a number of samples in a typical gesture (as discussed below). In accordance with example embodiments, trigger determination may be accomplished with p and K in a range of 1-5% of a typical number of samples in a typical gesture. In addition, keeping N>>p and K helps ensure that the sliding time window $W_{0,N}$ spans a time interval large enough to average out transient fluctuations of the background field, including possible valid triggers. In accordance with example embodiments, N≥1,000×p, K, although other relative sizes of N and p, K may be used that satisfy N>>p, K.

Figure 6:
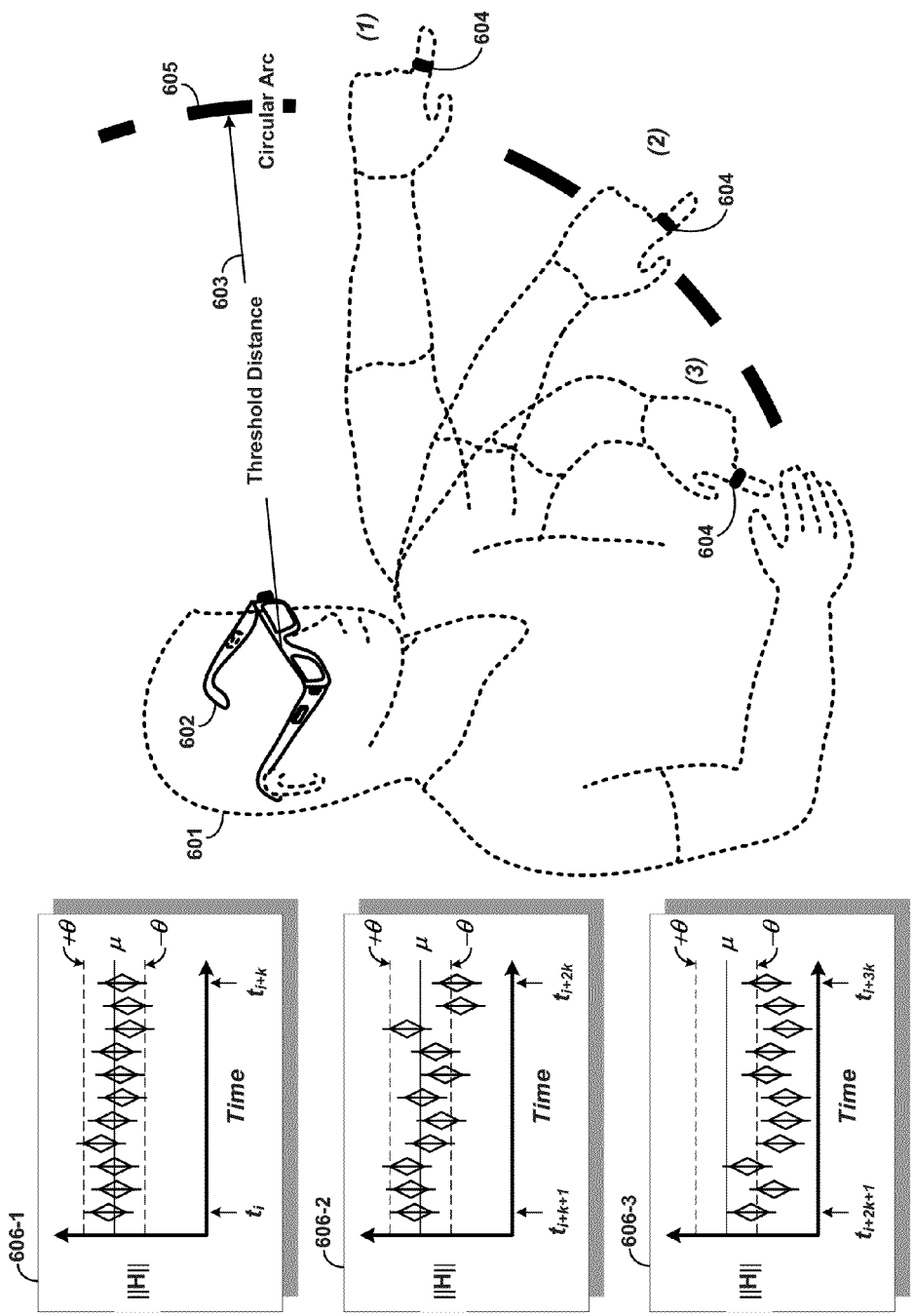
FIG. 6 illustrates an example wearable head-mounted display worn by a representation of an example user who is depicted as also wearing a hand-wearable magnet as in FIG. 5, and further illustrates a concept of detection by a magnetometer device of the head-mounted display, according to an example embodiment.

FIG. 6 is a conceptual illustration of determination of a trigger condition based on a perturbation of the background magnetic field by the HWM. A user 601 is depicted as wearing a HWM 602 that is equipped with a magnetometer device (not shown). By way of example, the user 601 is wearing a HWM in the form of a magnetic ring 604 on his left hand. Also by way of example, a threshold distance 603 delineates a spherical gesture detection region, represented by circular arc 605, within which a perturbation field caused by the ring 604 results in a trigger condition being satisfied. For purposes of illustration, the threshold distance 603 is depicted as measured from the front and center of the HMD 602; in practice a more accurate measure might be referenced to the location of the magnetometer on the HMD 602.

The user's left hand (and ring 604) is shown at three positions, labeled "(1)," "(2)," and "(3)," intended to represent motion of the user's left hand from position (1) to position (3). At position (1), the ring 604 is positioned beyond the threshold distance, and moving toward position (2). At position (2), the ring 604 is positioned at (or nearly at) the threshold distance, and approaching the spherical boundary delineated by the circular arc 605 as it moves toward position (3). At position (3), the ring 604 is positioned within the threshold distance (and possibly still moving within the gesture detection region).

As the user's left hand moves from position (1) to position (3), the perturbation of the background magnetic field by the magnetic ring 604 may be monitored and measured by the magnetometer of the HMD 602 in order to determine if and when a trigger condition occurs. This is illustrated in the insets 606-1, 606-2, and 606-3, which depict successive samples of field strength ∥H∥ as the ring 604 moves across the three example positions. Each inset shows a background field strength labeled μ (solid horizontal line), and a perturbation threshold labeled +θ and −θ (dashed horizontal lines) above and below the background. The successive samples, corresponding to $h_i$ in the discussion above, are shown as diamonds with short vertical lines at the respective sample times.

The inset 606-1 shows the samples $h_i$ at sample times $t_{i+1}, \ldots, t_{i+k}$, as the ring 604 moves from position (1) toward position (2). The inset 606-2 shows the samples $h_i$ at sample times $t_{i+k+1}, t_{i+k+2}, \ldots, t_{i+2k}$, as the ring 604 moves from position (2) towards and across the spherical boundary delineated by the circular arc 605. The inset 606-3 shows the samples $h_i$ at sample times $t_{i+2k+1}, t_{i+2k+2}, \ldots, t_{i+3k}$, as the ring 604 moves from across the spherical boundary toward position (3).

As illustrated, the samples $h_i$ at sample times $t_i, t_{i+1}, \ldots, t_{i+k}$ in the inset 606-1 evidently fluctuate near the sample mean $\mu$, but remain within $\pm\theta$ of the background. Accordingly, a trigger condition has not yet occurred. The samples $h_i$ at sample times $t_{i+k+1}, t_{i+k+2}, \ldots, t_{i+2k}$, (inset 606-2) show increasing deviations from $\mu$, with the last two, at times $t_{2k-1}$ and $t_{i+2k}$, falling below $-\theta$ (that is, more than $\theta$ below $\mu$). Referring again top in the above discussion, and taking p=2 by way of example, a trigger condition may be considered occurring at time $t_{i+2k}$ in the example illustrated FIG. 6. Alternatively, for p=1, a trigger condition may be considered occurring at time $t_{i+2k-1}$. This illustration also demonstrates that a trigger condition can correspond to a perturbation that is more than a threshold below (i.e. less than) background field.

Continuing with the example illustrated in FIG. 6, the samples $h_i$ at sample times $t_{i+2k+1}, t_{i+2k+2}, \ldots, t_{i+3k}$, (inset 606-3) show deviations that are predominantly more than $\theta$ below $\mu$. These could represent samples taken while a gesture is being made within the gesture detection region. Note that a few of the samples in the inset 606-3 appear to be within $\theta$ of $\mu$. However, once the trigger condition is detected (e.g. at time $t_{i+2k}$), it may remain in effect until one or more other conditions or events occur.

More particularly, the time at which a trigger condition is detected is referred to as $T_{start}$, and corresponds to the onset of the trigger condition. In accordance with example embodiments, the HMD will transition to operating in the gesture detection state upon determination of occurrence of a trigger condition at $T_{start}$. The HMD will continue to operate in the gesture detection state until one or more other conditions or combinations of conditions is determined by the HMD to occur, at which time the HMD will transition back to operating in the background detection state. As discussed in detail below, these other conditions include cessation of the trigger condition, expiration of a minimum detection window interval $W_{min}$, and detection of a gesture. There may be other conditions as well.

e. Gesture Detection and Gesture Detection State

Upon transitioning to operating in the gesture detection state, the HMD will use successive samples of the vector magnetic field $\vec{H}_i=[(H_x)_i, (H_y)_i, (H_z)_i]$ at sample times $t_i$, i=1, 2, \ldots, N to determine discrete time derivatives of $\vec{H}_i$ along the $\hat{x}$, $\hat{y}$, and $\hat{z}$ axes. More specifically, discrete time derivatives may be computed as:

$$\left.\begin{array}{l}\left(\dfrac{dH_x}{dt}\right)_i = \dfrac{1}{\Delta t}[(H_x)_{i+1} - (H_x)_i] \\[6pt] \left(\dfrac{dH_y}{dt}\right)_i = \dfrac{1}{\Delta t}[(H_y)_{i+1} - (H_y)_i] \\[6pt] \left(\dfrac{dH_z}{dt}\right)_i = \dfrac{1}{\Delta t}[(H_z)_{i+1} - (H_z)_i]\end{array}\right\} \text{ for } t_i, i=1, \ldots, N-1. \quad (7)$$

As defined above, $\Delta t$ is the sampling interval. Note that there may be one fewer time derivative for each axis than there are samples, since each computed time derivative uses two samples.

The sample times $t_i$, i=1, 2, \ldots, N for the computed time derivatives are generally different from the similarly-indexed times discussed above in connection with background detection and trigger determination. In particular, the samples $\vec{H}_i=[(H_x)_i, (H_y)_i, (H_z)_i]$ are acquired entirely or predominantly during a "gesture detection window" $W_g$ that begins (opens) at time $T_{start}$ and ends (closes) at $T_{stop}>T_{start}$. The gesture detection window corresponds to a time interval during which the HWM is presumed to be tracing out a gesture within the gesture detection region. Accordingly, the discrete derivatives computed according to equation (7) correspond to derivatives specific to motion of the HWM presumed to correspond to a particular gesture that is traced during the gesture detection window. As discussed below, the duration of $W_g$, given by $T_{stop}-T_{start}$, will generally be at least as long as the minimum detection window interval $W_{min}$, and may be longer depending on how long the trigger condition persists.

Figure 7:
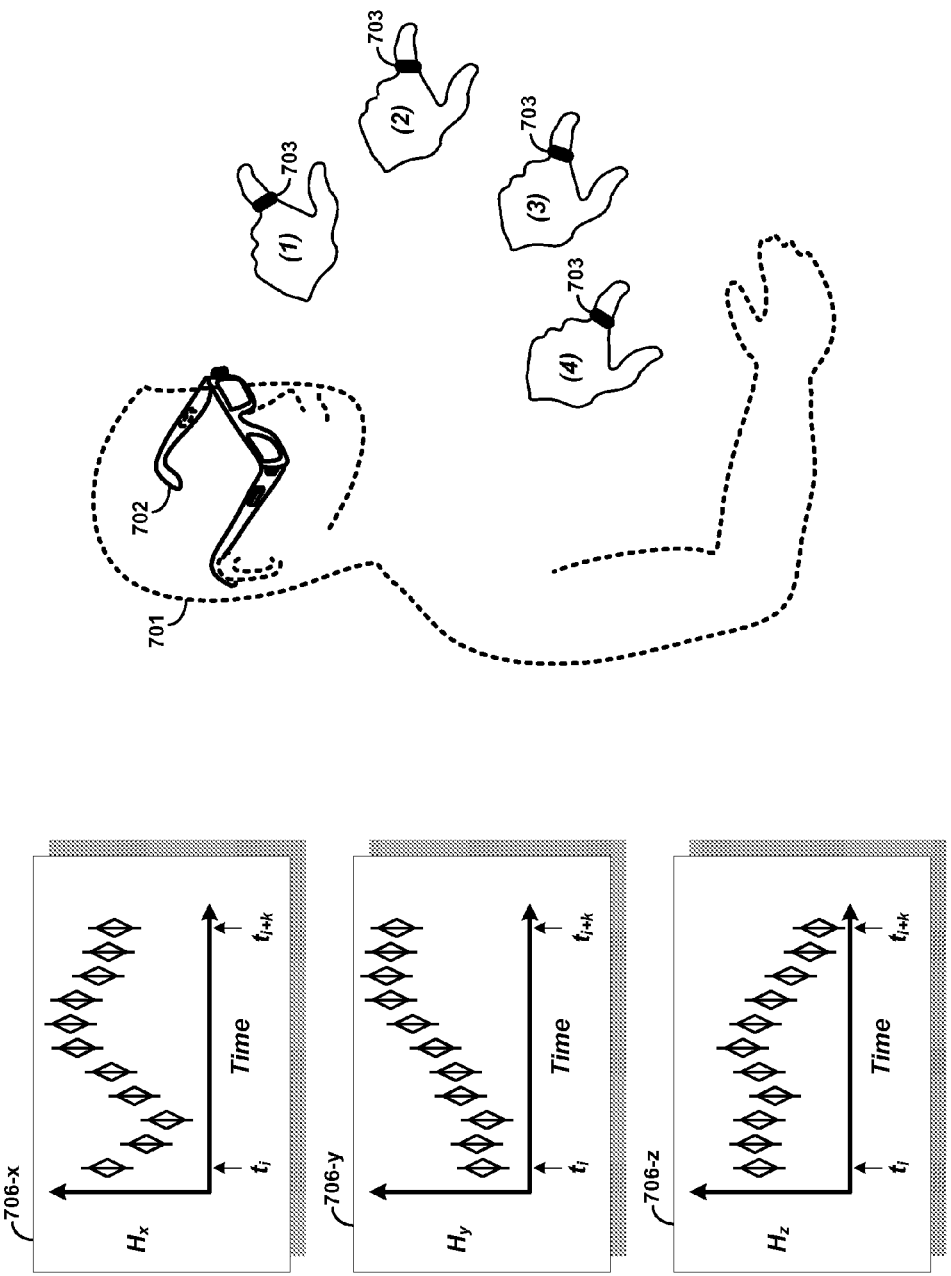
FIG. 7 illustrates an example wearable head-mounted display worn by a representation of an example user who is depicted as also wearing a hand-wearable magnet as in FIGS. 5 and 6, and further illustrates a concept of gesture sensing based on detection by a magnetometer device of the head-mounted display, according to an example embodiment.

FIG. 7 is a conceptual illustration of samples $\vec{H}_i=[(H_x)_i, (H_y)_i, (H_z)_i]$ acquired as a HWM traces out an example gesture while the HMD is in the gesture detection state. A user 701 is depicted as wearing a HWM 702 that is equipped with a magnetometer device (not shown). By way of example, the user 701 is wearing a HWM in the form of a magnetic ring 703 on his left hand, which is depicted as detached from the user's body in order to avoid an overly-complicated figure. The user's left hand (and ring 703) is shown at four positions, labeled "(1)," "(2)," "(3)," and "(4)," intended to represent motion of the user's left hand tracing a gesture. At each position in this example, the ring 703 is presumed to be within the gesture detection region.

As the ring 703 moves through the gesture (as represented by the four positions), the magnetometer acquires samples of $\vec{H}_i=[(H_x)_i, (H_y)_i, (H_z)_i]$ at each sample time. Sample acquisition is represented in the three insets 706-$x$, 706-$y$, and 706-$z$, which respectively show the strength of one of $H_x$, $H_y$, or $H_z$ as a function of time. The successive samples corresponding to $(H_x)_i$, $(H_y)_i$, $(H_z)_i$, are shown as diamonds with short vertical lines at the respective sample times. The sample times in this example, $t_{i+k}$, are the same for each axis. The particular values depicted for $(H_x)_i$, $(H_y)_i$ and $(H_z)_i$ are arbitrary, serving only as conceptual illustration.

In accordance with example embodiments, the HMD will compute the discrete derivatives according to equation (7) (or an algorithmically analogous form) to obtain a set of computed time derivatives, and then compare the set of computed time derivatives with one or more stored sets of pre-determined time derivatives in order to find a match. Each of the one or more stored sets will include a pre-determined association with a respective known gesture. Upon finding a match (or a closest match, as described below) between the set of computed time derivatives and a particular one of the stored sets of pre-determined time derivatives, the HMD may identify the respective known gesture associated with the particular stored set as the user's just-made gesture detected via the field $\vec{H}_i$ sampled during the gesture detection window.

Each set of computed time derivatives corresponds to a triplet of computed sequences of time derivatives (one sequence each for $\hat{x}$, $\hat{y}$, and $\hat{z}$). Similarly, each of the one or more stored sets of pre-determined time derivatives corresponds to a stored triplet of pre-determined sequences of time derivatives (again, one sequence each for $\hat{x}$, $\hat{y}$, and $\hat{z}$). Finding a match (or a closest match) then may be accomplished by simultaneously matching (or most closely matching) each respective computed ($\hat{x}$, $\hat{y}$, or $\hat{z}$) sequence of the triplet of computed sequences of time derivatives with each respective pre-determined ($\hat{x}$, $\hat{y}$, or $\hat{z}$) sequence of one of the stored triplets of pre-determined sequences of time derivatives.

Because the computed time derivatives are based on differences between successive samples of $\vec{H}_i=[(H_x)_i, (H_y)_i, (H_z)_i]$, the background magnetic field contribution to $\vec{H}_i$ is subtracted out. Similarly, each stored triplet of pre-determined sequences of time derivatives is based on differences between a reference set of successive samples of $\vec{H}_j$, so again, the background magnetic field contribution to $\vec{H}_j$ is subtracted out. Advantageously, any variations in the background magnetic fields between the samples $\vec{H}_i$ and $\vec{H}_j$ may be removed by the subtraction.

As described below, each stored set of pre-determined time derivatives corresponds to a respective known gesture that was previously carried out during operation of the HMD in a gesture recording state, in which the magnetometer acquired samples of $\vec{H}_i$ and the HMD computed and recorded the associated derivatives. As such, each stored set provides a reference set of time derivatives against which a subsequently detected, presumed gesture may be compared. In practice, a subsequent gesture traced by a HWM and detected by the magnetometer may not necessarily trace out a path strictly identical to that of a pre-determined gesture, even when the subsequent gesture is the same (e.g., intended by a user to be the same) as the pre-determined one. Moreover, the total number of derivatives computed for the subsequent gesture could be different from that of the stored set of pre-determined derivatives for the same (known) gesture. Accordingly, for any given set of computed time derivatives for a presumed gesture, the HMD may not necessarily find a strictly exact match with one of the stored sets of pre-determined time derivatives. As suggested above, finding a "closest match" or "most closely matching" may be sufficient to identify a known gesture with measurements of a presumed gesture.

More particularly, finding a "closest match" or "most closely matching" may be accomplished by treating each stored set of pre-determined time derivatives as a mathematical model of a respective known gesture, and further, by statistically evaluating a fit of the computed time derivatives to each model. The HMD could determine the closest match from among the stored sets as the one that yields the best statistical fit. Note that the HMD could also apply a statistical threshold for matching, such that failure to achieve at least the statistical threshold for any of the stored sets (models) in any given instance could correspond to failure to identify the measured, presumed gesture with any known gesture. It will be appreciated that there are various methods for quantitatively evaluating a fit of measured data to a model, or for quantitatively evaluating a fit of one set of measured data to another set of measured (or stored) data. It will be further appreciated that there other methods that could be used for determining a match between the computed time derivatives and one of the stored sets of pre-determined time derivatives. As an example, a hidden Markov model gesture recognition algorithm could be used.

In further accordance with example embodiments, upon identifying a known gesture based on a match (or closest match) as described above, the HMD may then invoke or carry out one or more actions associated with the known gesture. For example, the known gesture may be associated with a user input to the HMD, such as causing the HMD to upload a digital photo to a social networking website or server, or selecting a menu item displayed in the display area of the HMD. It will be appreciated that any number and variety of actionable or passive user inputs to the HMD could be associated with known gestures stored on the HMD.

As an alternative or an addition to gesture recognition based on comparison of computed time derivatives with stored sets of pre-determined time derivatives, a heuristic method could be used to recognize gestures based on characteristics of just the computed time derivatives. An example of such a heuristic approach may be illustrated by considering recognition of a horizontal "sweeping" or "swipe" gesture. Referring again to FIGS. 1a and 1b, and taking the lens elements 110 and 112 to define a plane of the field of view of the HMD, such a sweeping or swipe gesture could be considered as corresponding to movement of the HWM across the field of view of the HMD, with little or no movement perpendicular to the field-of-view plane.

More particularly, assuming the magnetometer to be fixed to the HMD, with its $\hat{x}$ and $\hat{y}$ axes lying in the field-of-view plane and its $\hat{z}$ axis perpendicular to the field-of-view plane, motion purely across the field of view of the HMD might be recognizable as motion for which all or most of the computed $\vec{z}$ time derivatives are zero (or largely so). If in addition, analysis of the determined $\vec{x}$ and $\vec{y}$ time derivatives indicates horizontal motion, a horizontal sweeping or swipe gesture could then be inferred. Finally, analysis of the signs of the $\vec{x}$ and $\vec{y}$ time derivatives could be used to determine the direction (i.e., leftward or rightward) of the horizontal sweeping or swipe gesture. Accordingly, such a horizontal sweeping or swipe gesture could be recognized without reference to stored sets of pre-determined time derivatives of known gestures. It will be appreciated that such an approach could be extended to enable recognition of vertical or diagonal sweeping or swipe gestures, as well as line-of-sight gestures, and possibly other gestures as well.

As noted above, the samples $\vec{H}_i=[(H_x)_i, (H_y)_i, (H_z)_i]$ used in computing the time derivatives are acquired at sample times $t_i$, i=1, 2, ..., N, entirely or predominantly within a gesture detection window $W_g$ that begins at time $T_{start}$ and ends at $T_{stop}>T_{start}$. In addition, $W_g$ is at least as long as the minimum detection window interval $W_{min}$. A minimum length time window provides for collection of a minimum number of samples $\vec{H}_i=[(H_x)_i, (H_y)_i, (H_z)_i]$ and thereby helps ensure a sufficient number of computed time derivatives for effectively comparing with the stored pre-determined sets of time derivatives. A minimum length time window also can help ensure that occurrences of cessation of the trigger condition do not prematurely end the gesture detection process. The gesture detection window $W_g$ may extend beyond $W_{min}$ if the trigger condition persists beyond $W_{min}$. Hence, the end of $W_g$ at $T_{stop}$ corresponds to a time at least $W_{min}$ beyond $T_{start}$ at which the HMD determines the trigger condition to cease.

In accordance with example embodiments, upon the start of a gesture detection window $W_g$ at $T_{start}$, the HMD will begin tracking the magnetic field magnitude samples $h_i$ for times $t_i \geq T_{start}$ in order to monitor for cessation of the trigger condition. Taking $T_{cease}$ to be the time that the HMD determines cessation of the trigger condition, and $\Delta t_{min}$ to be the length (duration) of the minimum time window $W_{min}$, the HMD will determine $T_{stop}$ as the longer of (i.e., the maximum of) $T_{cease}$ and the end of $W_{min}$:

$$T_{stop}=\max[T_{cease},(T_{start}+\Delta t_{min})]. \tag{8}$$

According to equation (8), if the HMD detects cessation of the trigger condition before the end of $W_{min}$, the gesture detection window will remain open until at least the end of $W_{min}$. If the HMD detects persistence of the trigger condition beyond the end of $W_{min}$, the gesture detection window will remain open until at least $T_{cease}$. It is convenient to specify the length (duration) of $W_{min}$ in terms of number of sample intervals, $N_{min}$.

In further accordance with example embodiments, the HMD may determine that a trigger condition has ceased by determining a threshold number of consecutive sample deviations $d_i$ below the perturbation threshold, or alternatively, by determining a threshold fractional number of sample deviations $d_i$ measured below the perturbation threshold. Either alternative form for $T_{cease}$ can be determined by computing the trigger function $\text{Trigger}_i$ over a sliding time window $W_{0,K}$, where K is small compared with $N_{min}$. This corresponds to searching for cessation over a time window $W_{0,K}$ that is short compared with $W_{min}$ and that slides across $W_g$ starting from $T_{start}$. By way of example, K could be approximately 0.06× $N_{min}$, though other values could satisfy $K<<N_{min}$.

Initially, $t_0$ of the $W_{0,K}$ is $T_{start}$. Thereafter $t_0$ increments across $W_g$ as the window slides with each new sample interval. At any time $t_0$ for which the last $q \leq K$ consecutive values of $\text{Trigger}_i = 0$, the HMD may determine that cessation of the trigger condition has occurred. Alternatively, any time $t_0$ for which the last $q \leq K$ out of K values of $\text{Trigger}_i = 0$, the HMD may determine that cessation of the trigger condition has occurred. These two alternatives may be respectively expressed analytically as:

$$T_{cease} = t_0 \text{ if } \Sigma_{i=0}^{q \leq k} \text{Trigger}_i = 0, \quad (9a)$$

and $$T_{cease} = t_0 \text{ if } \Sigma_{i=0}^{K-1} \text{Trigger}_i \leq K - q, q \leq K. \quad (9b)$$

Accordingly, the HMD may use either of equations (9a) or (9b) (or an algorithmically analogous form) to determine $T_{cease}$, and equation (8) to determine $T_{stop}$. Note that the HMD may apply equation (9a) or (9b) repeatedly in instances where either yields $T_{cease} < T_{start} + \Delta t_{min}$.

In accordance with example embodiments, the HMD may accumulate magnetic field samples $\vec{H}_i$ in a buffer (e.g., in memory such as program data 208 in FIG. 2) for determination of both $h_i$ and the computed derivatives. While operating in the background detection state, the HMD may skip computing discrete derivatives, and only compute $h_i$. While operating in the gesture detection state, the HMD may compute both $h_i$ and the discrete derivatives.

In further accordance with example embodiments, the HMD may include in the computation of the derivatives some samples $\vec{H}_i$ accumulated during just before $T_{start}$. This could help improve the accuracy of gesture detection for instances in which the start of a gesture precedes determination of an associated trigger condition by a few samples. In practice, the number of pre-trigger samples included in gesture detection (i.e., computed derivatives) would be expected to be small; e.g. approximately 10 or fewer.

In accordance with example embodiments, the HMD may compute the discrete derivatives and search for a matching known gesture based on an accumulation of field samples $\vec{H}_i$ acquired over either the entire gesture detection window $W_g$ or over just a portion of $W_g$. More particularly, the HMD may accumulate field samples up until $T_{stop}$, and thereafter compute the derivatives and analyze them for detection of a known gesture. Alternatively, the HMD may begin computing derivatives and analyzing them for detection of a known gesture after acquiring a threshold number of samples, where the threshold number is some fraction of the total number of samples corresponding to a full gesture detection window. In this alternative approach, the HMD may continue to acquire samples as it analyzes them, until a known gesture is detected. This could allow "early" gesture detection in instances when less than a full number of samples are sufficient to make the determination.

In further accordance with example embodiments, the HMD may transition back to operating in the background detection state at $T_{stop}$. As an alternative, the HMD may transition back to the background detection state upon either identification of a known gesture based on analysis of the computed derivatives (i.e., comparison with pre-stored derivatives), or failure to identify any known gesture. As still a further alternative, the HMD may remain in the gesture detection state if the trigger condition persists even upon or after identification of a known gesture. In this case, the HMD may begin a new gesture detection cycle using new set of acquired samples, without first transitioning back to the background detection state. For example, a user might make multiple gestures without ever moving the HWM (e.g., magnetic ring) outside of the gesture detection region.

f. Gesture Recording and Gesture Recording State

As described above, analysis of computed time derivatives of $\vec{H}_i$ for gesture recognition may be based on comparing the computed derivatives with one or more stored sets of pre-determined time derivatives, where each stored set is respectively associated with a known gesture. In accordance with example embodiments, each set of pre-determined time derivatives may be generated and stored on the HMD during operation in a gesture recording state.

More specifically, during operation in the gesture recording state, the HMD may apply a gesture recording procedure that is largely the same as the gesture detection procedure described above, except that instead of matching computed time derivatives to stored ones, the HMD treats a set of computed time derivatives as a new (or replacement) known gesture and records (stores) them together with an identifier of the known gesture. Accordingly, equation (7) again applies to computation of time derivatives. However, while operating in the gesture detection state, the HMD records the computed time derivatives. The HMD also creates a three-way association between the recorded, computed time derivatives, an identifier of a known gesture, and a pre-determined action that may be carried out by the HMD.

In further accordance with example embodiments, the HMD will transition to operating in the gesture recording state upon determining the occurrence of a recording trigger. More particularly, a recording trigger may be used to signal to the HMD that the next detected gesture (as traced by the HWM) should be treated as a new or replacement gesture. The recording trigger may also include an indication of an identifier of the new or replacement gesture, as well as the associated pre-determined action. Thereafter, when the HWM acquires samples of $\vec{H}_i$ and computes time derivatives from them, it will store the time derivatives together with the three-way association for the gesture. Note that a replacement gesture is one for which the stored time derivatives and three-way association replaces a previous version of the same for an existing (i.e. previously stored) known gesture.

In still further accordance with example embodiments, a recording trigger may correspond to a particular input or command that includes both an indication that a new or replacement gesture is about to be made (e.g., the next detected gesture) and the pre-determined action that should be associated with the gesture once it is detected and recorded. The trigger could also include the gesture identifier.

Alternatively, the gesture identifier could be determined by the HMD as an internal parameter. As still another alternative, a recording trigger could include just an indication to record the time derivatives. Identification of a pre-determined action could be made subsequently.

By way of example, a user could use an already-known gesture as a recording trigger for the next subsequent gesture. Alternatively, a user could use another form of user input to the HMD to indicate a recording trigger. For example, referring again to FIG. 1, a user could use the finger-operable touchpad 124 to signal a recording trigger. Other forms of user input could be used as well.

In accordance with example embodiments, the HMD could be operating in the background detection state prior to receiving a recording trigger and responsively transitioning to operating in the gesture detection state. Upon completion of recording a new or replacement gesture while operating in the gesture recording state, the HMD could then transition back to operating in the background detection state.

g. Motion-based enhancements and motion compensation

In practical usage of a HMD by a user, there may be instances in which the HMD is moving and/or changing orientation relative to the background (geomagnetic) field. For example, the user could be in a moving vehicle, changing direction while walking, or even just shaking his or her head in a way that can alter the alignment between the axes of the magnetometer and the background field. Motion and/or changing orientation can be detected by a HMD using one or more of the motion sensing devices, such as could be part of the motion sensor 232 in FIG. 2. For example, an accelerometer, a gyroscope, or a magnetometer, as described below. The effect of motion and/or changing orientation on magnetometer measurements can manifest in a variety of ways, and can call for one or another form of compensation applied to operations discussed above, or can provide additional modes of input for enhancing gesture detection based on magnetic sensing.

At a given fixed location, a change in the orientation of the magnetometer (i.e., of the HMD) with respect to the background magnetic field will not change the measured field magnitude at that location. Consequently, such a change in orientation will not generally affect HMD operations based only on measured field magnitude. For example, a change in orientation that occurs while the HMD is operating in the background detection state will not affect operation of the magnitude-based trigger mechanism discussed above. In contrast, a change in the orientation of the magnetometer with respect to the background magnetic field can cause a change in the relative strengths of the measured field vector components $H_x$, $H_y$, and $H_z$. Consequently, such a change in orientation can affect HMD operations based on measured strengths of field vector components. For example, a change in orientation that occurs while the HMD is operating in the gesture detection state and over a timescale approximately comparable to that of a typical gesture can cause the computed time derivatives to deviate from those obtained in the absence of a change in orientation.

In accordance with example embodiments, while operating in the background detection state, the HMD can use a change in the relative strengths of the measured field vector components $H_x$, $H_y$, and $H_z$ as an alternative trigger. More specifically, even in the absence of a magnitude-based trigger from a HWM, the HMD may determine that a particular orientation change detected via a change in the relative strengths of $H_x$, $H_y$, and $H_z$ corresponds to a pre-determined trigger. In response, the HMD may transition to operating in the gesture detection state. By way of example, the HMD could recognize a particular head-motion gesture of a user by determining that a change in the relative strengths of measured samples $(H_x)_i$, $(H_y)_i$, and $(H_z)_i$ corresponds to pre-determined, pre-recorded relative changes associated with the particular head-motion gesture (or trigger). The pre-determined, pre-recorded relative changes could be established using a procedure similar to that described above for gesture recording. Further to this example, a user could use a nod or a shake of his or her head to trigger the start of a hand gesture (i.e., transition of the HMD to the gesture detection state). Other orientation-change-based gestures and/or triggers could be similarly devised and used as well.

Detected orientation changes could additionally or alternatively signal conditions under which magnetic gesture detection by the HMD could be hampered. In further accordance with example embodiments, while operating in the background detection state, the HMD can use a change in the relative strengths of the measured field vector components $H_x$, $H_y$, and $H_z$ to determine that a transition to the gesture detection state should be disabled, at least while the orientation is changing. Such an action could be used to disable attempted gesture recognition under conditions that might otherwise be prone to an unacceptable or unrecoverable error in computing and/or analyzing time derivatives from samples acquired while the orientation is changing. By way of example, the HMD could ignore a magnitude-based trigger from a HWM that occurs while the orientation is determined to be changing, or at least changing in a manner that does not correspond to a known orientation-change-based trigger.

Although a changing orientation can affect computed time derivatives, it may be possible to compensate for such changing orientation so as to preserve a level of reliability and/or accuracy of gesture detection, even in the presence changing orientation. More specifically, by measuring orientation changes concurrently with the acquisition of samples of $\vec{H}_i$ during operation in the gesture detection state, the changing orientation may be accounted for and largely or entirely removed. The HMD may measure changing orientation by means of a motion sensing device, such as the motion sensor 232 in FIG. 2. In particular, the sensor may include a gyroscope that can be used by the HMD to determine orientation changes in a form that can be applied to analytically adjust the measured samples $\vec{H}_i$ to yield computed time derivatives with motion-related components largely or entirely removed.

A change in orientation of the magnetometer with respect to the background magnetic field can be represented as a rotation in three-dimensional space, and expressed analytically in terms of a rotation matrix $R \in SO(3)$, where $SO(3)$ refers to the "special orthogonal rotation group" in three dimensions. In the absence of rotation, any two successive samples of magnetic field $\vec{H}_i$ and $\vec{H}_{i-1}$ may be expressed as:

$$\vec{H}_i = \vec{E} + \vec{M}_i, \tag{10a}$$

and $$\vec{H}_{i-1} = \vec{E} + \vec{M}_{i-1}. \tag{10b}$$

In these expressions, $\vec{E}$ is the Earth's magnetic field (i.e., the background field), assumed to be constant from one sample to the next, and $\vec{M}_i$ and $\vec{M}_{i-1}$ are the vector contributions from the HWM measured from one sample to the next as the HWM traces out a gesture. Accordingly, the difference between successive field samples (upon which the computed derivative is based) can be expressed as:

$$\Delta \vec{H}_i = \vec{H}_i - \vec{H}_{i-1} = \vec{M}_i - \vec{M}_{i-1}. \quad (11)$$

As discussed above, the background field is subtracted out, leaving only the difference between the HWM-produced field samples.

When the magnetometer rotates between samples, the difference between successive field samples can instead be expressed as:

$$(\Delta \vec{H}_i)_R = R_i \vec{H}_i - \vec{H}_{i-1} = R_i(\vec{E} + \vec{M}_i) - (\vec{E} + \vec{M}_{i-1}), \quad (12)$$

where $R_i$ corresponds to the rotation matrix at time $t_i$. In this case, the background field does not cancel between samples, because it has been rotated with respect to the magnetometer from one sample to the next. More particularly, $R_i$ specifies the rotation of the magnetic field vector from its direction at time $t_{i-1}$ to its direction at time $t_i$. By determining the effect of rotation can be removed.

In accordance with example embodiments, the HMD may be equipped with a gyroscope, and may use measurements from the gyroscope to determine R. More specifically, the gyroscope may be configured to measure an angular velocity three-vector $\vec{\Omega}$ in the same frame of reference as the magnetometer. The magnitude $\omega \equiv \|\vec{\Omega}\|$ of the angular velocity vector corresponds to an angular rotation rate (e.g., radians per second, or degrees per second), and the direction $\hat{\omega} = \vec{\Omega}/\omega$ of the angular velocity vector specifies the axis of rotation. For a given increment of time dt, $\phi = \omega dt$ gives the angle of rotation. The form of the rotation matrix R may be derived from $\vec{\Omega}$, $\omega$, $\hat{\omega}$, and $\phi$, as is known in the art. The effect of R operating on a vector $\vec{v}$ is to rotate $\vec{v}$ around $\hat{\omega}$ by an angle $\phi$ in time dt.

By acquiring angular velocity measurements in successive samples $\vec{\Omega}_i$ at discrete sampling times $t_i$, i=1, 2, ..., N, the HMD may compute $\omega_i$, $\hat{\omega}_i$, and $\phi_i$ to determine $R_i$ at $t_i$. The sampling times for the angular velocity measurements are taken to the same as those for the magnetic field measurements, so that $\Delta t = t_{i+1} - t_i$ is the same for all i. The effect of $R_i$ operating on $\vec{H}_i$ is to rotate $\vec{H}_i$ around $\hat{\omega}_i$ by an angle $\phi_i$ in time $\Delta t$.

In practice, the rotation represented by $R_i$ is already in the measurement of the magnetic field sample $R_i \vec{H}_i$ in equation (12). However, the effect of the rotation on the measurement can be removed by using the inverse of the rotation matrix. Specifically, let the inverse of $R_i$ be $R_i^{-1}$. Then applying $R_i^{-1}$ to the measurement $R_i \vec{H}_i$ in equation (12) gives:

$$R_i^{-1} R_i \vec{H}_i - \vec{H}_{i-1} = R_i^{-1} R_i(\vec{E} + \vec{M}_i) - (\vec{E} + \vec{M}_{i-1}) = \vec{M}_i - \vec{M}_{i-1}. \quad (13)$$

Thus, the Earth's magnetic field again cancels, and the unrotated form of $\Delta \vec{H}_i$ in equation (11) may be recovered. It will be appreciated that $R_i^{-1}$ can be determined from $R_i$ by known methods.

In accordance with example embodiments, the HMD may acquire samples $\vec{\Omega}_i$ and determine $R_i$ and $R_i^{-1}$ at sample times $t_i$. The HMD may then use equation (13) (or an algorithmically analogous form) to compute discrete time derivatives corrected for changes in orientation of the magnetometer with respect to the background magnetic field occurring (or that occurred) while magnetic field samples $\vec{H}_i$ are being (or were) acquired, also at sample times $t_i$. Advantageously, the gesture recognition based on magnetic sensing of a HWM may thus be carried out while the magnetometer of the HMD is undergoing a change in orientation with respect to the background magnetic field.

h. Multiple Magnetometers

In accordance with example embodiments, a magnetometer device of a HMD may include more than one three-axis magnetometer. In particular, a magnetometer device may include two three-axis magnetometers mounted on the HMD with a baseline distance between them. For example, they could be mounted at opposite ends of eyeglasses 102 in FIGS. 1a and/or 2a. In such a configuration, the two magnetometers could provide the HMD with a stereoscopic view of time derivatives associated with HWM-base gestures.

More specifically, for identical magnetometers "Mag1" and "Mag2" mounted on an HMD and separated by the typically small width of eyeglasses (e.g., approximately 4-5 inches), the background magnetic field (e.g., the geomagnetic field) will be identical for practical purposes considered herein. If the axes of Mag1 and Mag2 are identically oriented, then the vector components of the background field will also be identical for like axes of Mag1 and Mag2. Accordingly, Mag1 and Mag2 can be calibrated in the absence of any disturbance to the background field to ensure that they both measure the same vector component values of the background magnetic field.

In particular, the background magnetic field measured at any given sample time $t_i$, i=1, 2, ..., N, by Mag1 and Mag2 will be the same. Thus, the magnetic fields measured respectively by Mag1 and Mag2 at time $t_i$ can be expressed as $(\vec{H}_1)_i$ and $(\vec{H}_2)_i$, where $(\vec{H}_1)_i = (\vec{H}_2)_i$. It also follows that $(h_1)_i = (h_2)_i$ where $(h_1)_i$ and $(h_2)_i$ are correspond $h_i$ determined from $(\vec{H}_1)_i$ and $(\vec{H}_2)_i$, respectively. As a consequence, subtracting the background field magnitude measured by Mag1 from that measured by Mag2 on a sample-by-sample basis can zero out the background, since $(h_1)_i - (h_2)_i = 0$.

Since the size scale of the gesture detection region is typically only slightly larger than, but of the same order of magnitude of, the separation between Mag1 and Mag2, the respective angular displacements between the HWM and each of Mag1 and Mag2 will generally be measurably different during gesture detection (i.e., while the HWM is within the gesture detection region). At the same time, because Mag1 and Mag2 measure the same background field, the perturbation-based triggering method described above may be applied with greater sensitivity, since the background field contribution can be removed prior to monitoring for perturbations. Thus, the use of Mag1 and Mag2 to may allow for more sensitive triggering of gesture detection.

In addition to using Mag1 and Mag2 to cancel out the background magnetic field, each could also function individually in the manner described above for just a single magnetometer. The HMD could then combine the measurements of to the two magnetometers to support a more precise trigger definition, enhance the accuracy of trigger detection and determination while operating in the background detection state, enhance the accuracy of gesture recognition while operating in the gesture detection state, and support the creation and recognition of more complex gestures.

In further accordance with example embodiments, while operating in the background detection state, the HMD may determine the occurrence of a trigger condition by determining that measurements from both magnetometers concurrently indicate a magnitude-based trigger condition from the HWM. Alternatively, the HMD may determine the occurrence of a trigger condition by determining that measurements from at least one of the magnetometers indicate a magnitude-based trigger condition from the HWM. Similarly, orientation-change-based trigger detection could be determined from concurrent orientation-change-based triggers from both magnetometers, or an orientation-change-based trigger from at least one of the magnetometers.

In still further accordance with example embodiments, gesture recognition using two magnetometers could combine individual time derivatives from both magnetometers into a three-dimensional (e.g., stereoscopic) view of time derivatives. This could introduce one or more additional spatial dimensions to gesture creation and gesture recognition. As an example, a hand gesture in the form a circle might be used to enclose an area of display viewed within the field of view of the HMD. The HMD might then create a digital photograph of the enclosed area. By using two magnetometers to recognize the circular gesture, the distance of the HWM from the HMD when the gesture is made could be determined, and the size of the enclosed area in the field of view thereby adjusted according to the determined distance. In this way, a single gesture could produce different results when analyzed by the HMD, based (in this example) on distance from the HMD. Other modes of combining derivatives from two magnetometers to enhance gesture recognition are possible as well.

i. Higher-Order Multipole Magnetic Elements and Alternate Forms of HWMs

In accordance with example embodiments, the HWM may include a magnetic element that produces a magnetic field of higher order than just a dipole field. For example, the HWM could produce a quadrupole magnetic field. As is known, the magnitude of a quadrupole magnetic field falls off as $r^{-4}$, where r is the distance from the source of the field. Consequently the gesture detection region for a HWM with a quadrupole field could be smaller and have a sharper boundary than one with just a dipole magnetic field, since a dipole magnetic field falls off as as $r^{-3}$. Moreover, a HWM could include multiple dipole magnetic elements, or combined dipole and quadurpole magnetic elements, configured in relative orientations so as to produce field geometries that are non-spherical at distances within a gesture detection region. This could be used to create a non-spherical gesture detection region.

In further accordance with example embodiments, the HWM could take a form other than a single ring. For example, the HWM could be in form of multiple rings, or other hand-worn jewelry. The HWM could also be in the form of a magnetic decal affixed to one or more fingernails, or one or more magnetize artificial fingernails. Combining a multiple-finger HWM with one or more three-axis magnetometers could allow recognition of complex gestures involving combined motions of two or more fingers, in addition to bulk hand motion. Moreover, the HWM could take the form of a fashionable or stylish adornment having potential marketing value beyond its function in gesture sensing by the magnetometer device.

j. Example Method

The example embodiments for magnetometer-based gesture detection and recognition described above in operational terms of can be implemented as a method on a wearable HMD equipped with a magnetometer device. An example embodiment of such a method is described below.

Figure 8:
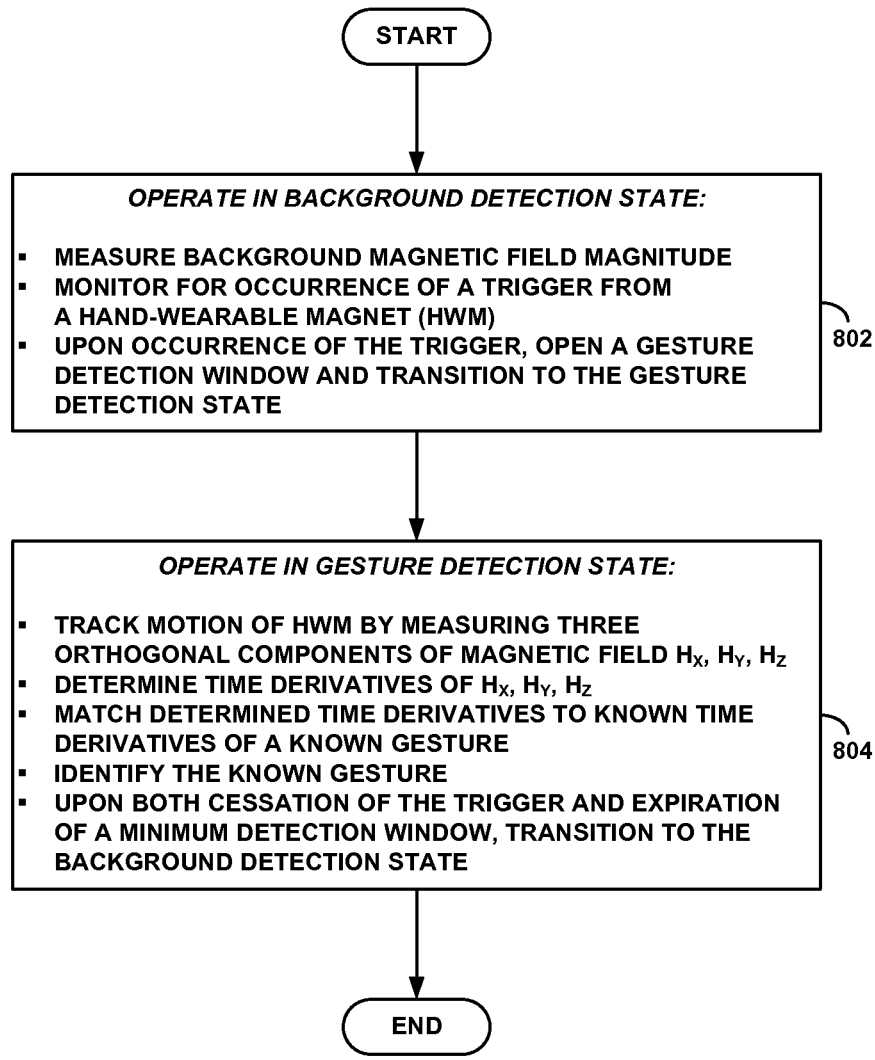
FIG. 8 is a flowchart illustrating an example embodiment of a method in a wearable computing device for magnetometer-based gesture sensing.

FIG. 8 is a flowchart illustrating an example embodiment of a method in a wearable computing system, such as a wearable HMD, for magnetometer-base gesture detection and recognition. The illustrated steps of the flowchart could be implemented in the wearable head-mounted display as executable instructions stored in one or another form of memory, and executed by one or more processors of the wearable head-mounted display. The HMD could include a magnetometer or magnetometer device for carrying out measurements used in the method. Examples of a wearable HMD include the wearable computing system 100 in FIG. 1 and the wearable computing system 202 in FIG. 2. The executable instructions could also be stored on some form of non-transitory tangible computer readable storage medium, such as magnetic or optical disk, or the like, and provided for transfer to the wearable head-mounted display's memory during configuration or other procedure(s) for preparing the wearable head-mounted display for operation.

As shown, at step 802 the HMD operates in a background detection state. While operating in the background detection state, the HMD carries various functions of the background detection state. These include measuring the magnitude of the background magnetic field with a magnetometer device, monitoring for occurrence of a trigger from a HWM, and upon occurrence of the trigger, opening a gesture detection window and transitioning to operating in a gesture detection state.

At step 804, the HMD operates in the gesture detection state. While operating in the gesture detection state, the HMD carries various functions of the gesture detection state. These include tracking motion of the HWM by measuring three orthogonal components of the magnetic field $H_x$, $H_y$, and $H_z$ with the magnetometer device, determining time derivatives of $H_x$, $H_y$, and $H_z$, matching the determined time derivatives to known time derivatives of a known gesture, identifying the known gesture, and upon both cessation of the trigger and expiration of a minimum detection window, transitioning to operating in the background detections state.

In accordance with the example embodiment, measuring the magnitude of the background magnetic field with a magnetometer device while operating in the background detection state (step 802) could be achieved as described in the discussion above of the background detection state. More particularly, the HMD could determine the magnitude of the background magnetic field from time sample measurements of three orthogonal components of the magnetic field $H_x$, $H_y$, and $H_z$ from the magnetometer device, as described above in connection with the discussion of equations (2a), (2b), and (2c).

In further accordance with the example embodiment, the HMD could monitor for a trigger from the HWM while operating in the background detection state (step 802), monitoring for occurrence of a trigger from a HWM by determining a the perturbation by the HWM of the background field magnitude remains at least as large as the perturbation threshold for at least a first threshold length of time. For example, the HMD could determine that a time-average value of the perturbation of the determined field magnitude remains at least as large as the perturbation threshold for at least the first threshold length of time.

More particularly, the HMD could apply the operations described in connection with equations (4)-(6) in the discussion above of trigger determination in order to monitor for occurrence of a trigger. For example, the HMD could detect at least a threshold number of deviations exceeding a threshold perturbation. The time at which the HMD determines the trigger to occur could then be taken to be a start time $T_{start}$. The HMD could thus open the gesture detection window and transition to operating in the gesture detection state at $T_{start}$.

In accordance with the example embodiment, while operating in the gesture detection state (step 804), the HMD could apply the operations described in connection with equation (7) in the discussion above of the gesture detection state in order to determine the time derivatives of the three orthogonal components of the magnetic field $H_x$, $H_y$, and $H_z$ measured at sample times by the magnetometer device.

In further accordance with the example embodiment, while operating in the gesture detection state (step 804), the HMD could then compare the determined time derivatives to known time derivatives of a known gesture, and thereby identify the known gesture. Details are again described in the discussion above of the gesture detection state.

In further accordance with the example embodiment, specifying both cessation of the trigger and expiration of a minimum window as a condition for the HMD to transition from the operating in the background detection state (step 804) provides for a minimum number of magnetic field samples to be acquired and analyzed. Cessation of the trigger could be based on determining that the perturbation by the HWM of the background field magnitude remains less than the perturbation threshold for at least a second threshold length of time. For example, the HMD could determine that a time-average value of the perturbation of the determined field magnitude remains less than the perturbation threshold for at least the second threshold length of time. Once more, details are described in the discussion above of the gesture detection state.

In further accordance with the example embodiment, in responsive to identifying the respective known gesture, the HMD could identify a pre-determined computer-executable action associated with the identified known gesture. The HMD could then carry out the action. In this way, gesture recognition based on magnetic sensing of a HWM can provide a means of user input and interaction with the HMD.

In further accordance with the example embodiment, the example method could include a gesture recording state, as described above. In addition, the example method could include motion enhancements and/or motion compensation, also described above. In still further accordance with the example embodiment, and once more as described above, the example method could include additional steps for acquiring and analyzing magnetic field measurements from a second magnetometer.

It will be appreciated that the steps shown in FIG. 8 are meant to illustrate operation of an example embodiment. As such, various steps could be altered or modified, the ordering of certain steps could be changed, and additional steps could be added, while still achieving the overall desired operation.

Figure 9A:
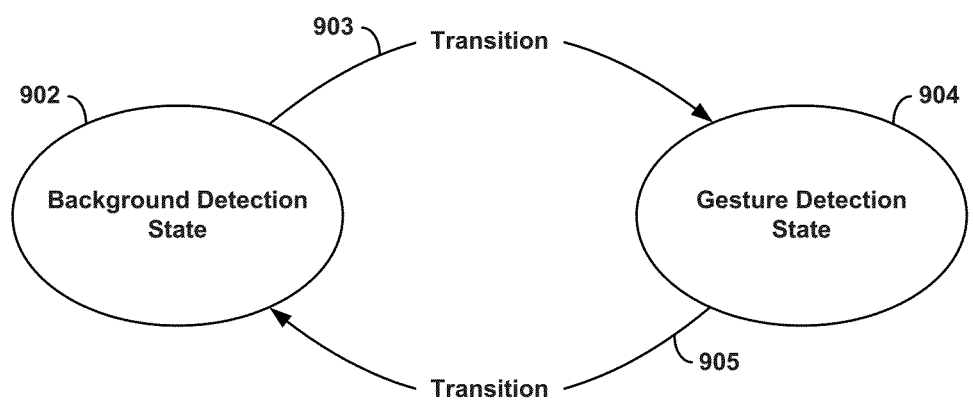
FIG. 9a depicts a state diagram including a background detection state and gesture detection state, according to an example embodiment.

FIG. 9a depicts a state diagram including a background detection state and gesture detection state, according to an example embodiment. Operation of the HMD in the background detection state 902 includes the functions of this state described above. Upon determination that a trigger has occurred, the HMD makes a transition 903 to the gesture detection state 904. Operation of the HMD in the gesture detection state 904 includes the functions of this state described above. Upon both cessation of the trigger and expiration of a minimum detection window, the HMD make a transition 905 to the background detection state.

Figure 9B:
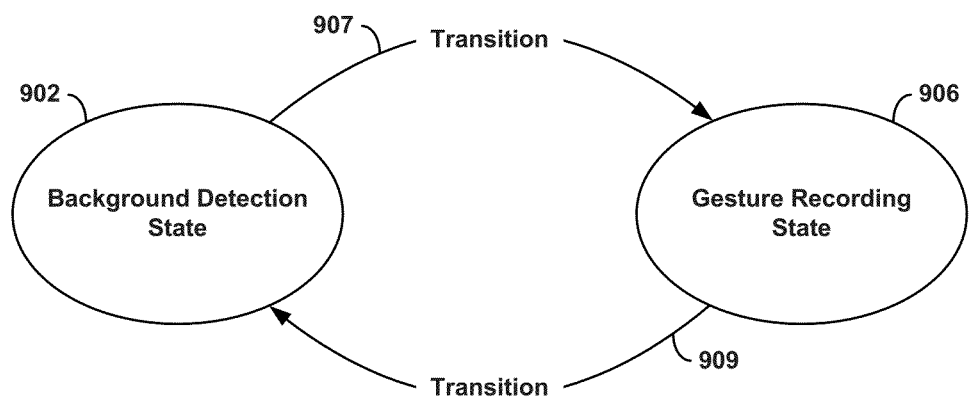

FIG. 9b depicts a state diagram including a background detection state and gesture recording state, according to an example embodiment. Operation of the HMD in the background detection state 902 again includes the functions of this state described above. Upon determination that a recording trigger has occurred, the HMD make a transition 907 to the gesture recording state 906. Operation of the HMD in the gesture detection state 906 includes the functions of this state described above. Upon both completion of storing a new or replacement gesture, together with a gesture identifier and the associated recorded time derivatives, the HMD make a transition 909 to the background detection state.

It will be appreciated that each of the background detection state, the gesture detection state, and the gesture recording state could respectively include other functions not explicitly described herein, so long as any such other functions of that respective state are not exclusive to or contradictory to the functions of that respective state that are described herein.

CONCLUSION

An illustrative embodiment has been described by way of example herein. Those skilled in the art will understand, however, that changes and modifications may be made to this embodiment without departing from the true scope and spirit of the elements, products, and methods to which the embodiment is directed, which is defined by the claims.

What is claimed:

1. In a wearable head-mounted display (HMD) having a processor and a magnetometer device with three orthogonal measurement axes, a computer-implemented method comprising:
    operating in a background detection state;
    while operating in the background detection state, carrying out functions of the background state including,
        measuring three orthogonal components of a background magnetic field with the magnetometer device, and determining a field magnitude of the background magnetic field from the three measured orthogonal components,
        determining an occurrence of a trigger from a hand-wearable magnet (HWM) at a time $T_{start}$ upon detecting a perturbation by the HWM of the determined field magnitude at least as large as a perturbation threshold,
        and upon determining the occurrence of the trigger, transitioning to operating in a gesture detection state; and
    while operating in the gesture detection state, carrying out functions of the gesture detection state including,
        for the duration of the gesture detection state, tracking motion of the HWM by determining time derivatives of magnetic field strength measured by the magnetometer device along each of the three orthogonal measurement axes,
        making a comparison of the determined time derivatives with one or more sets of pre-determined time derivatives of magnetic field strength, each of the one or more sets being stored at the wearable HMD and each being associated with a respective known gesture,
        upon matching the determined time derivatives with a particular set of the one or more sets based on the comparison, identifying the respective known gesture associated with the particular set,
        and transitioning to operating in the background detection state upon both of, measuring the magnitude perturbation by the HWM of the determined field magnitude to be less than the perturbation threshold, and determining an expiration of a time interval W that begins at $T_{start}$.

2. The method of claim 1, further comprising:
    responsive to identifying the respective known gesture associated with the particular set, identifying a pre-determined computer-executable action associated with the identified respective known gesture; and carrying out the identified pre-determined computer-executable action with the processor.

3. The method of claim 1, wherein detecting the perturbation by the HWM of the determined field magnitude at least as large as the perturbation threshold comprises determining that the perturbation by the HWM of the determined field magnitude remains at least as large as the perturbation threshold for at least a threshold length of time.

4. The method of claim 3, wherein determining that the perturbation by the HWM of the determined field magnitude remains at least as large as the perturbation threshold for at least the threshold length of time comprises determining that a time-average value of the perturbation of the determined field magnitude remains at least as large as the perturbation threshold for at least the threshold length of time.

5. The method of claim 1, wherein measuring the magnitude perturbation by the HWM of the determined field magnitude to be less than the perturbation threshold comprises determining that the perturbation by the HWM of the determined field magnitude remains less than the perturbation threshold for at least a threshold length of time.

6. The method of claim 5, wherein determining that the perturbation by the HWM of the determined field magnitude remains less than the perturbation threshold for at least the threshold length of time comprises determining that a time-average value of the perturbation of the determined field magnitude remains less than the perturbation threshold for at least the threshold length of time.

7. The method of claim 1, wherein measuring the three orthogonal components of the background magnetic field with the magnetometer device comprises measuring magnetic field components $H_x$, $H_y$, and $H_z$ of a magnetic field vector $\vec{H}=[H_x, H_y, H_z]$ at consecutive discrete times $t_i$, $i=N_1, \ldots, N_2$, over a sliding time window $W_{N_1,N_2}$ from $N_1$ to $N_2$, wherein $N_2=N_1+N-1$, and $N \geq 1$, and wherein determining the field magnitude of the background magnetic field from the three measured orthogonal components comprises:
computing magnetic field magnitude samples $h_i = \|H\| = \sqrt{H_x^2 + H_y^2 + H_z^2}$ at the consecutive discrete times $t_i$, $i=N_1, \ldots, N_2$ over $W_{N_1,N_2}$; and
computing a sample mean field strength $\mu_{N_1,N_2} = 1/N \Sigma_{i=N_1}^{N_2} h_i$ over $W_{N_1,N_2}$.

8. The method of claim 7, wherein detecting the perturbation by the HWM of the determined field magnitude at least as large as the perturbation threshold comprises:
making a determination that at least one of the field magnitude samples $h_j$ deviates from $\mu_{N_1,N_2}$ by an amount at least as large as the perturbation threshold, wherein $N_1 \leq j \leq N_2$.

9. The method of claim 8, wherein $N \geq 2$,
and wherein making the determination that the at least one of the field magnitude samples $h_j$ deviates from $\mu_{N_1,N_2}$ by an amount at least as large as the perturbation threshold comprises:
computing a standard deviation $$\sigma_{N_1,N_2} = \sqrt{\frac{1}{N-1} \sum_{i=N_1}^{N_2} (h_i - \mu_{N_1,N_2})^2}$$

over $W_{N_1,N_2}$; and
determining that for the at least one of the field magnitude samples $h_j$, a deviation $$d_j = \sqrt{\frac{(h_j - \mu_{N_1,N_2})^2}{\sigma_{N_1,N_2}^2}}$$

is at least as large as a threshold deviation $\theta$, wherein the perturbation threshold is $\theta \times \phi_{N_1,N_2}$.

10. The method of claim 9, wherein determining that $d_j$ is at least as large as $\theta$ for the at least one of the field magnitude samples $h_j$ comprises:
determining that $d_j \geq \theta$ for at least q values of j over $W_{N_1,N_2}$ as $W_{N_1,N_2}$ slides across p time increments, wherein $q \leq p$.

11. The method of claim 8, wherein the wearable HMD further includes a motion detector,
and wherein making the determination that the at least one of the field magnitude samples $h_j$ deviates from $\mu_{N_1,N_2}$ by an amount at least as large as the perturbation threshold comprises both of:
determining that the at least one of the field magnitude samples $h_j$ deviates from $\mu_{N_1,N_2}$ by an amount at least as large as the perturbation threshold; and
concurrently determining that the motion detector is detecting motion at no greater than a threshold level of motion.

12. The method of claim 1, wherein determining the time derivatives of magnetic field strength measured by the magnetometer device along each of the three orthogonal measurement axes comprises:
during at least a portion of the time interval W, measuring orthogonal magnetic field components $H_x$, $H_y$, and $H_z$ of a magnetic field vector $\vec{H}=[H_x, H_y, H_z]$ at consecutive discrete times $t_i$, $i=1, \ldots, N$, wherein $N \geq 2$, to obtain samples of the of $H_x$, $H_y$, and $H_z$ at the consecutive discrete times $t_i$, $i=1, \ldots, N$; and
computing discrete time derivatives of the measured orthogonal magnetic field components $H_x$, $H_y$, and $H_z$ from discrete differences between successive samples.

13. The method of claim 12, wherein each of the one or more sets of pre-determined time derivatives of magnetic field strength comprises a respective triplet of pre-determined sequences of discrete time derivatives of a magnetic field along the three orthogonal measurement axes,
and wherein matching the determined time derivatives with the particular set of the one or more sets based on the comparison comprises:
determining a closest match between the computed discrete time derivatives and the respective triplet of pre-determined sequences of discrete time derivatives of one of the one or more sets.

14. The method of claim 12, wherein $t_i$ for $i=1$ is one of $t_1 < T_{start}$, $t_1 = T_{start}$, and $t_i > T_{start}$.

15. The method of claim 1, wherein each of the one or more sets of pre-determined time derivatives of magnetic field strength comprises a respective triplet of pre-determined sequences of discrete time derivatives of a magnetic field along the three orthogonal measurement axes,
and wherein the method further comprises:
receiving a recording command, and responsively transitioning to operating in a gesture recording state; and
while operating in the gesture recording state, carrying out functions of the gesture recording state including,
determining an occurrence of a recording trigger from the HWM by detecting a perturbation by the HWM of the determined field magnitude at least as large as a recording perturbation threshold, upon determining the occurrence of the recording trigger, measuring orthogonal magnetic field components $H_x$, $H_y$, and $H_z$ of a magnetic field vector $\vec{H}=[H_x, H_y, H_z]$ at consecutive discrete times $t_i$, i=1, ..., N, wherein N≥2, to obtain samples of the of $H_x$, $H_y$, and $H_z$ at the consecutive discrete times $t_i$, i=1, ..., N, computing discrete time derivatives of the measured orthogonal magnetic field components $H_x$, $H_y$, and $H_z$ from discrete differences between successive samples to obtain a recorded triplet of sequences of discrete time derivatives $$\left(\frac{dH_x}{dt}\right)_i, \left(\frac{dH_y}{dt}\right)_i, \text{ and } \left(\frac{dH_z}{dt}\right)_i,$$

for N−1 consecutive values of i between i=1 and i=N,
creating an association between the recorded triplet of sequences of discrete time derivatives, an identifier of a respective pre-determined gesture, and an identifier of a pre-determined computer-executable action,
and storing the recorded triplet of sequences of discrete time derivatives, the identifier of the respective pre-determined gesture, the identifier of the pre-determined computer-executable action, and the created association.

16. The method of claim 1, further comprising:
while operating in the gesture detection state, carrying out further functions of the gesture detection state including,
upon matching the determined time derivatives with the particular set of the one or more sets based and identifying the respective known gesture associated with the particular set, transitioning to operating in the background detection state,
and upon failing to match the determined time derivatives with the set of any of the one or more sets, transitioning to operating in the background detection state.

17. The method of claim 1, further comprising:
while operating in the gesture detection state, carrying out further functions of the gesture detection state including,
upon matching the determined time derivatives with the particular set of the one or more sets based and identifying the respective known gesture associated with the particular set:
continuing to track motion of the HWM by determining subsequent time derivatives of magnetic field strength measured by the magnetometer device along each of the three orthogonal measurement axes,
making an additional comparison of the determined subsequent time derivatives with the one or more sets of pre-determined time derivatives of magnetic field strength,
and upon matching the determined subsequent time derivatives with a given set of the one or more sets based on the additional comparison, identifying the respective known gesture associated with the given set.

18. The method of claim 1, further comprising:
while operating in the background detection state, carrying out further functions of the background detection state including,
determining the occurrence of the trigger by detecting a directional perturbation of the determined field magnitude corresponding to motion of the wearable HMD with respect to the background magnetic field, wherein the directional perturbation is at least as large as a directional perturbation threshold.

19. The method of claim 1, wherein the three orthogonal measurement axes comprise a first triplet of orthogonal measurement axes of the magnetometer device,
wherein the magnetometer device comprises a second triplet of orthogonal measurement axes,
and wherein the method further comprises:
while operating in the background detection state, carrying out further functions of the background state including,
measuring three orthogonal components of the background magnetic field with the second triplet of orthogonal axes to determine a supplementary field magnitude of the background magnetic field,
determining an occurrence of a supplementary trigger from the HWM by detecting a supplementary perturbation by the HWM of the determined supplementary field magnitude at least as large as a supplementary perturbation threshold,
and upon determining the occurrence of at least one of the trigger and the supplementary trigger, transitioning to operating in the gesture detection state; and
while operating in the gesture detection state, carrying out further functions of the gesture detection state including,
tracking motion of the HWM by determining supplementary time derivatives of magnetic field strength measured with the second triplet of orthogonal axes,
making a joint comparison of the determined time derivatives and the determined supplementary time derivatives with one or more combined sets of pre-determined time derivatives and pre-determined supplementary time derivatives, each of the one or more combined sets being stored at the wearable HMD and each being associated with one of the respective known gestures,
and upon jointly matching both the determined time derivatives and the determined supplementary time derivatives with a particular combined set of the one or more combined sets based on the joint comparison, identifying the respective known gesture associated with the particular combined set.

20. The method of claim 1, wherein the HWM comprises a magnet with at least one of: a dipole magnetic field and a quadrupole magnetic field.

21. In a wearable head-mounted display (HMD) having a processor and a magnetometer device with three orthogonal measurement axes, a computer-implemented method comprising:
operating in a background detection state;
while operating in the background detection state, carrying out functions of the background state including,
measuring three orthogonal components of a background magnetic field with the magnetometer device, and determining a field magnitude of the background magnetic field from the three measured orthogonal components,
determining an occurrence of a trigger from a hand-wearable magnet (HWM) at a time $T_{start}$ upon detecting a perturbation by the HWM of the determined field magnitude at least as large as a perturbation threshold,
and upon determining the occurrence of the trigger, transitioning to operating in a gesture detection state; and
while operating in the gesture detection state, carrying out functions of the gesture detection state including,
for the duration of the gesture detection state, tracking motion of the HWM by determining time derivatives of magnetic field strength measured by the magnetometer device along each of the three orthogonal measurement axes, analyzing the determined time derivatives to determine a known gesture, identifying a pre-determined computer-executable action associated with the determined known gesture, and transitioning to operating in the background detection state upon both of, measuring the magnitude perturbation by the HWM of the determined field magnitude to be less than the perturbation threshold, and determining an expiration of a time interval W that begins at $T_{start}$.

22. A wearable head-mount display (HMD) comprising:

a processor;

memory accessible to the processor;

a magnetometer device with three orthogonal measurement axes; and executable instructions stored in the memory that upon execution by the processor cause the HMD to carry out operations including:

operating in a background detection state, while operating in the background detection state, carrying out functions of the background state including:

measuring three orthogonal components of a background magnetic field with the magnetometer device, and determining a field magnitude of the background magnetic field from the three measured orthogonal components, determining an occurrence of a trigger from a hand-wearable magnet (HWM) at a time $T_{start}$ by detecting a perturbation upon the HWM of the determined field magnitude at least as large as a perturbation threshold, and upon determining the occurrence of the trigger, transitioning to operating in a gesture detection state, and while operating in the gesture detection state, carrying out functions of the gesture detection state including:

for the duration of the gesture detection state, tracking motion of the HWM by determining time derivatives of magnetic field strength measured by the magnetometer device along each of the three orthogonal measurement axes, making a comparison of the determined time derivatives with one or more sets of pre-determined time derivatives of magnetic field strength, wherein each of the one or more sets is stored at the wearable HMD and each is associated with a respective known gesture, upon matching the determined time derivatives with a particular set of the one or more sets based on the comparison, identifying the respective known gesture associated with the particular set, and transitioning to operating in the background detection state upon both of, measuring the magnitude perturbation by the HWM of the determined field magnitude to be less than the perturbation threshold, and determining an expiration of a time interval W that begins at $T_{start}$.

23. The wearable HMD of claim 22, wherein the operations further include:

responding to identifying the respective known gesture associated with the particular set by identifying a pre-determined computer-executable action associated with the identified respective known gesture; and carrying out the identified pre-determined computer-executable action with the processor.

24. The wearable HMD of claim 22, wherein measuring three orthogonal components of a background magnetic field with the magnetometer device comprises measuring magnetic field components $H_x$, $H_y$, and $H_z$ of a magnetic field vector $\vec{H}=[H_x, H_y, H_z]$ at consecutive discrete times $t_i$, $i=1,\ldots,N_2$, over a sliding time window $W_{N_1,N_2}$ from $N_1$ to $N_2$, wherein $N_2=N_1+N-1$ and $N\geq 1$, wherein determining the field magnitude of the background magnetic field from the three measured orthogonal components comprises:

computing magnetic field magnitude samples $h_i=\|H\|=\sqrt{H_x^2+H_y^2+H_z^2}$ at the consecutive discrete times $t_i$, $i=1,\ldots,N_2$ over $W_{N_1,N_2}$; and computing a sample mean field strength $\mu_{N_1,N_2}=1/N\Sigma_{i=N_1}^{N_2} h_i$ over $W_{N_1,N_2}$, and wherein detecting the perturbation by the HWM of the determined field magnitude at least as large as the perturbation threshold comprises making a determination that at least one of the field magnitude samples $h_j$ deviates from $\mu_{N_1,N_2}$ by an amount at least as large as the perturbation threshold, wherein $N_1\leq j\leq N_2$.

25. The wearable HMD of claim 24, wherein the wearable HMD further includes a motion detector, wherein making the determination that the at least one of the field magnitude samples $h_j$ deviates from $\mu_{N_1,N_2}$ by an amount at least as large as the perturbation threshold comprises both of:

determining that the at least one of the field magnitude samples $h_j$ deviates from $\mu_{N_1,N_2}$ by an amount at least as large as the perturbation threshold; and concurrently determining that the motion detector is detecting motion at no greater than a threshold level of motion.

26. The wearable HMD of claim 22, wherein each of the one or more sets of pre-determined time derivatives of magnetic field strength comprises a respective triplet of pre-determined sequences of discrete time derivatives of a magnetic field along the three orthogonal measurement axes, wherein determining the time derivatives of magnetic field strength measured by the magnetometer device along each of the three orthogonal measurement axes comprises:

during at least a portion of the time interval W, measuring orthogonal magnetic field components $H_x$, $H_y$, and $H_z$ of a magnetic field vector $\vec{H}=[H_x, H_y, H_z]$ at consecutive discrete times $t_i$, $i=1,\ldots,N$, wherein $N\geq 2$, to obtain samples of the of $H_x$, $H_y$, and $H_z$ at the consecutive discrete times $t_i$, $i=1,\ldots,N$; and computing discrete time derivatives of the measured orthogonal magnetic field components $H_x$, $H_y$, and $H_z$ from discrete differences between successive samples, and wherein matching the determined time derivatives with the particular set of the one or more sets based on the comparison comprises determining a closest match between the computed discrete time derivatives and the respective triplet of pre-determined sequences of discrete time derivatives of one of the one or more sets.

27. The wearable HMD of claim 22, wherein each of the one or more sets of pre-determined time derivatives of magnetic field strength comprises a respective triplet of pre-determined sequences of discrete time derivatives of a magnetic field along the three orthogonal measurement axes, and wherein the operations further include:
transitioning to operating in a gesture recording state in response to receiving a recording command; and
while operating in the gesture recording state, carrying out functions of the gesture recording state including,
   determining an occurrence of a recording trigger from the HWM by detecting a perturbation by the HWM of the determined field magnitude at least as large as a recording perturbation threshold,
   upon determining the occurrence of the recording trigger, measuring orthogonal magnetic field components $H_x$, $H_y$, and $H_z$ of a magnetic field vector $\vec{H}=[H_x, H_y, H_z]$ at consecutive discrete times $t_i$, i=1, ..., N, wherein N≥2, to obtain samples of the of $H_x$, $H_y$, and $H_z$ at the consecutive discrete times $t_i$, i=1, ..., N,
   computing discrete time derivatives of the measured orthogonal magnetic field components $H_x$, $H_y$, and $H_z$ from discrete differences between successive samples to obtain a recorded triplet of sequences of discrete time derivatives $$\left(\frac{dH_x}{dt}\right)_i, \left(\frac{dH_y}{dt}\right)_i, \text{and } \left(\frac{dH_z}{dt}\right)_i,$$

for N−1 consecutive values of i between i=1 and i=N,
   creating an association between the recorded triplet of sequences of discrete time derivatives, an identifier of a respective pre-determined gesture, and an identifier of a pre-determined computer-executable action,
   and storing the recorded triplet of sequences of discrete time derivatives, the identifier of the respective pre-determined gesture, the identifier of the pre-determined computer-executable action, and the created association.

28. The wearable HMD of claim 22, wherein the three orthogonal measurement axes comprise a first triplet of orthogonal measurement axes of the magnetometer device,
   wherein the magnetometer device comprises a second triplet of orthogonal measurement axes,
   wherein operating in the background detection state further comprises carrying out further functions of the background detection state including:
      measuring three orthogonal components of the background magnetic field with the second triplet of orthogonal axes to determine a supplementary field magnitude of the background magnetic field,
      determining an occurrence of a supplementary trigger from the HWM by detecting a supplementary perturbation by the HWM of the determined supplementary field magnitude at least as large as a supplementary perturbation threshold,
      and upon determining the occurrence of at least one of the trigger and the supplementary trigger, transitioning to operating in the gesture detection state;
   and wherein operating in the gesture detection state further comprises carrying out further functions of the gesture detection state including:
      tracking motion of the HWM by determining supplementary time derivatives of magnetic field strength measured with the second triplet of orthogonal axes,
      making a joint comparison of the determined time derivatives and the determined supplementary time derivatives with one or more combined sets of pre-determined time derivatives and pre-determined supplementary time derivatives, each of the one or more combined sets being stored at the wearable HMD and each being associated with one of the respective known gestures,
      upon jointly matching both the determined time derivatives and the determined supplementary time derivatives with a particular combined set of the one or more combined sets based on the joint comparison, identifying the respective known gesture associated with the particular combined set.

29. A nontransitory computer-readable medium having instructions stored thereon that, upon execution by one or more processors of a wearable head-mounted display (HMD), cause the wearable HMD to carry out operations comprising:
   operating in a background detection state;
   while operating in the background detection state, carrying out functions of the background state including,
      measuring three orthogonal components of a background magnetic field using three orthogonal measurement axes of magnetometer device of the wearable HMD, and determining a field magnitude of the background magnetic field from the three measured orthogonal components,
      determining an occurrence of a trigger from a hand-wearable magnet (HWM) at a time $T_{start}$ upon detecting a perturbation by the HWM of the determined field magnitude at least as large as a perturbation threshold,
      and upon determining the occurrence of the trigger, transitioning to operating in a gesture detection state; and
   while operating in the gesture detection state, carrying out functions of the gesture detection state including,
      for the duration of the gesture detection state, tracking motion of the HWM by determining time derivatives of magnetic field strength measured by the magnetometer device along each of the three orthogonal measurement axes,
      making a comparison of the determined time derivatives with one or more sets of pre-determined time derivatives of magnetic field strength, wherein each of the one or more sets is configured to be stored at the wearable HMD and each is associated with a respective known gesture,
      upon matching the determined time derivatives with a particular set of the one or more sets based on the comparison, identifying the respective known gesture associated with the particular set,
      and transitioning to operating in the background detection state upon both of, measuring the magnitude perturbation by the HWM of the determined field magnitude to be less than the perturbation threshold, and determining an expiration of a time interval W that begins at $T_{start}$.

30. The nontransitory computer-readable medium of claim 29, wherein the instructions, upon execution by one or more processors of the wearable HMD, cause the wearable HMD to carry out further operations comprising:
   responsive to identifying the respective known gesture associated with the particular set, identifying a pre-determined computer-executable action associated with the identified respective known gesture; and
   carrying out the identified pre-determined computer-executable action.

31. The nontransitory computer-readable medium of claim 29, wherein detecting the perturbation by the HWM of the determined field magnitude at least as large as the perturbation threshold comprises determining that the perturbation by the HWM of the determined field magnitude remains at least as large as the perturbation threshold for at least a first threshold length of time, and wherein measuring the magnitude perturbation by the HWM of the determined field magnitude to be less than the perturbation threshold comprises determining that the perturbation by the HWM of the determined field magnitude remains less than the perturbation threshold for at least a second threshold length of time.

32. The nontransitory computer-readable medium of claim 29, wherein measuring the three orthogonal components of a background magnetic field comprises measuring magnetic field components $H_x$, $H_y$, and $H_z$ of a magnetic field vector $\vec{H}=[H_x, H_y, H_z]$ at consecutive discrete times $t_i$, i=1, ..., $N_2$, over a sliding time window $W_{N_1,N_2}$ from $N_1$ to $N_2$, wherein $N_2=N_1+N-1$ and $N\geq 1$, wherein determining the field magnitude of the background magnetic field from the three measured orthogonal components comprises:

computing magnetic field magnitude samples $h_i=\|H\|=\sqrt{H_x^2+H_y^2+H_z^2}$ at the consecutive discrete times $t_i$, $i=N_1, \ldots, N_2$ over $W_{N_1,N_2}$; and computing a sample mean field strength $\mu_{N_1,N_2}=1/N\Sigma_{i=N_1}^{N_2} h_i$ over $W_{N_1,N_2}$, and wherein detecting the perturbation by the HWM of the determined field magnitude at least as large as the perturbation threshold comprises making a determination that at least one of the field magnitude samples $h_j$ deviates from $\mu_{N_1,N_2}$ by an amount at least as large as the perturbation threshold, wherein $N_1 \leq j \leq N_2$.

33. The nontransitory computer-readable medium of claim 32, wherein making the determination that the at least one of the field magnitude samples $h_j$ deviates from $\mu_{N_1,N_2}$ by an amount at least as large as the perturbation threshold comprises both of:

determining that the at least one of the field magnitude samples $h_j$ deviates from $\mu_{N_1,N_2}$ by an amount at least as large as the perturbation threshold; and concurrently determining that a motion detector of the wearable HMD is detecting motion at no greater than a threshold level of motion.

34. The nontransitory computer-readable medium of claim 29, wherein each of the one or more sets of pre-determined time derivatives of magnetic field strength comprises a respective triplet of pre-determined sequences of discrete time derivatives of a magnetic field along the three orthogonal measurement axes, wherein determining the time derivatives of magnetic field strength measured by the magnetometer device along each of the three orthogonal measurement axes comprises:

during at least a portion of the time interval W, measuring orthogonal magnetic field components $H_x$, $H_y$, and $H_z$ of a magnetic field vector $\vec{H}=[H_x, H_y, H_z]$ at consecutive discrete times $t_i$, i=1, ..., N, wherein $N\geq 2$, to obtain samples of the of $H_x$, $H_y$, and $H_z$ at the consecutive discrete times $t_i$, i=1, ..., N; and computing discrete time derivatives of the measured orthogonal magnetic field components $H_x$, $H_y$, and $H_z$ from discrete differences between successive samples, and wherein matching the determined time derivatives with the particular set of the one or more sets based on the comparison comprises determining a closest match between the computed discrete time derivatives and the respective triplet of pre-determined sequences of discrete time derivatives of one of the one or more sets.

35. The nontransitory computer-readable medium of claim 29, wherein each of the one or more sets of pre-determined time derivatives of magnetic field strength comprises a respective triplet of pre-determined sequences of discrete time derivatives of a magnetic field along the three orthogonal measurement axes, and wherein the instructions, upon execution by one or more processors of the wearable HMD, cause the wearable HMD to carry out further operations comprising:

receiving a recording command, and responsively transitioning to operating in a gesture recording state; and while operating in the gesture recording state, carrying out functions of the gesture recording state including, determining an occurrence of a recording trigger from the HWM by detecting a perturbation by the HWM of the determined field magnitude at least as large as a recording perturbation threshold, upon determining the occurrence of the recording trigger, measuring orthogonal magnetic field components $H_x$, $H_y$, and $H_z$ of a magnetic field vector $\vec{H}=[H_x, H_y, H_z]$ at consecutive discrete times $t_i$, i=1, ..., N, wherein $N\geq 2$, to obtain samples of the of $H_x$, $H_y$, and $H_z$ at the consecutive discrete times $t_i$, i=1, ..., N, computing discrete time derivatives of the measured orthogonal magnetic field components $H_x$, $H_y$, and $H_z$ from discrete differences between successive samples to obtain a recorded triplet of sequences of discrete time derivatives $$\left(\frac{dH_x}{dt}\right)_i, \left(\frac{dH_y}{dt}\right)_i, \text{ and } \left(\frac{dH_z}{dt}\right)_i,$$

for N−1 consecutive values of i between i=1 and i=N, creating an association between the recorded triplet of sequences of discrete time derivatives, an identifier of a respective pre-determined gesture, and an identifier of a pre-determined computer-executable action, and storing the recorded triplet of sequences of discrete time derivatives, the identifier of the respective pre-determined gesture, the identifier of the pre-determined computer-executable action, and the created association.

* * * * *